United States Patent
Ueda et al.

[11] Patent Number: 5,859,800
[45] Date of Patent: Jan. 12, 1999

[54] DATA HOLDING CIRCUIT AND BUFFER CIRCUIT

[75] Inventors: Kimio Ueda; Hiroyuki Morinaka; Koichiro Mashiko, all of Tokyo, Japan

[73] Assignee: Mitsubishi Denki Kabushiki Kaisha, Tokyo, Japan

[21] Appl. No.: 949,821

[22] Filed: Oct. 14, 1997

Related U.S. Application Data

[63] Continuation of Ser. No. 744,826, Nov. 6, 1996, abandoned.

[30] Foreign Application Priority Data

May 14, 1996 [JP] Japan ................................. 8-119005

[51] Int. Cl.⁶ ..................................................... G11C 7/00
[52] U.S. Cl. ................................ 365/189.05; 365/189.08
[58] Field of Search ........................ 365/189.05, 189.08, 365/154, 155, 227; 326/40; 327/210, 211

[56] References Cited

U.S. PATENT DOCUMENTS 5,384,735  1/1995  Park et al. .......................... 365/189.05
5,406,528  4/1995  Kim ..................................... 365/189.05
5,424,983  6/1995  Wojcicki et al. .................... 365/189.05
5,561,634  10/1996  Yang .................................. 365/189.05

*Primary Examiner*—Tan T. Nguyen
*Attorney, Agent, or Firm*—Oblon, Spivak, McClelland, Maier & Neustadt, P.C.

[57] ABSTRACT

A highly reliable data holding circuit with a reduced circuit area and reduced power consumption is disclosed. Output terminals (DO, DOB) are connected to input terminals (DI, DIB) receiving signals at H and L levels (potentials VDD and GND) in mutually exclusive relation through transistors (MN2, MN1) and inverters (INV1, INV2). Input terminals of the inverters (INV1, INV2) are connected to power supplies (VDD) through transistors (MP2, MP1) having gate electrodes connected to output terminals of the inverters (INV2, INV1), respectively. The transistors (MN2, MN1) cause a voltage drop of the signals to be applied to the inverters (INV1, INV2) by the amount of a threshold voltage (Vthn). One of the transistors (MP1, MP2) which receives a signal at L level at its control terminal provides a potential (VDD) to the input terminal of one of the inverters (INV1, INV2) which is to output a signal at L level, compensating for the voltage drop by the amount of the threshold voltage (Vthn).

10 Claims, 19 Drawing Sheets

F I G. 4
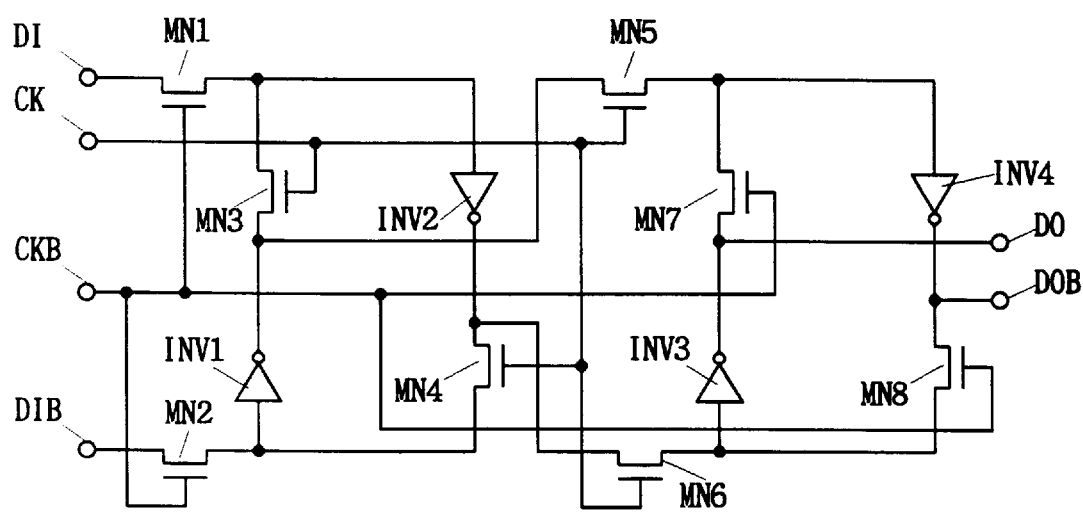

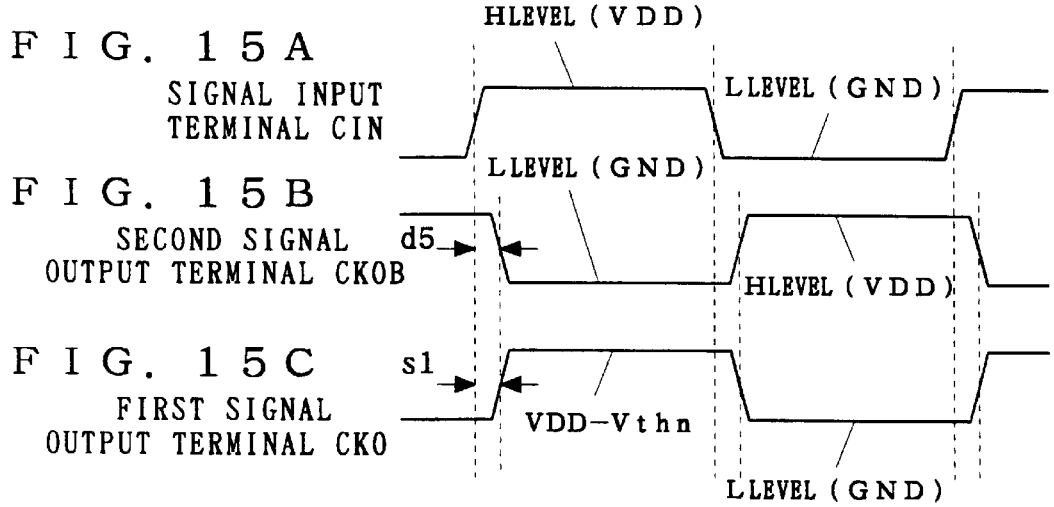
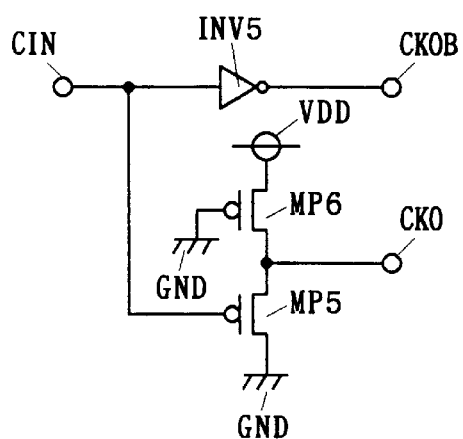

SIGNAL INPUT
TERMINAL CIN

SECOND SIGNAL
OUTPUT TERMINAL CKOB

FIRST SIGNAL
OUTPUT TERMINAL CKO

SIGNAL INPUT
TERMINAL CIN

SECOND SIGNAL
OUTPUT TERMINAL CKOB

FIRST SIGNAL
OUTPUT TERMINAL CKO

HLEVEL (VDD)
LLEVEL (GND)
LLEVEL (GND)
HLEVEL (VDD)
$VDD-Vthn$
$GND+Vthp$

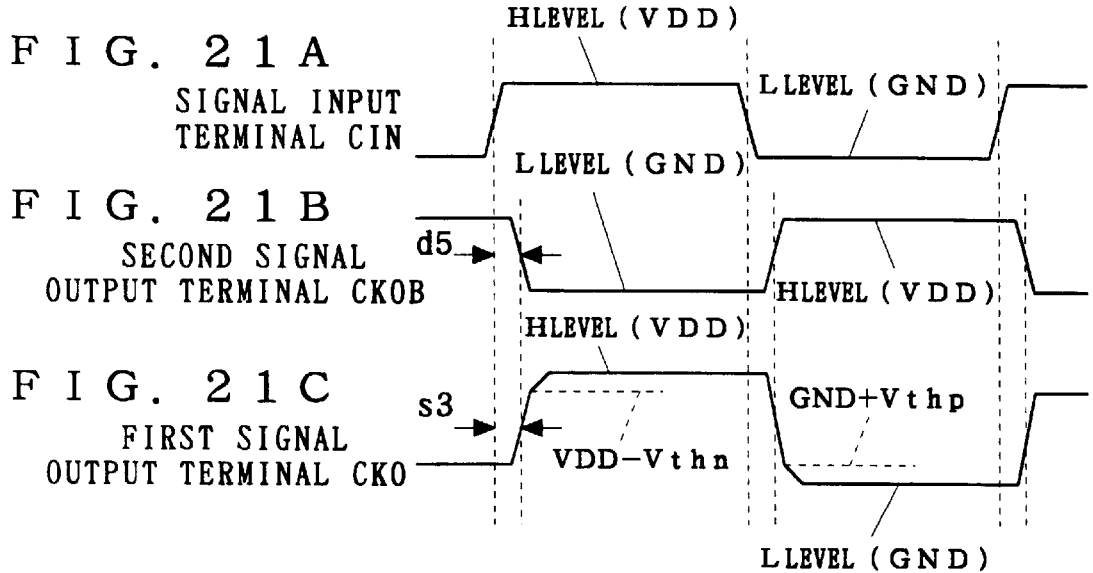
FIG. 21A SIGNAL INPUT TERMINAL CIN
FIG. 21B SECOND SIGNAL OUTPUT TERMINAL CKOB
FIG. 21C FIRST SIGNAL OUTPUT TERMINAL CKO
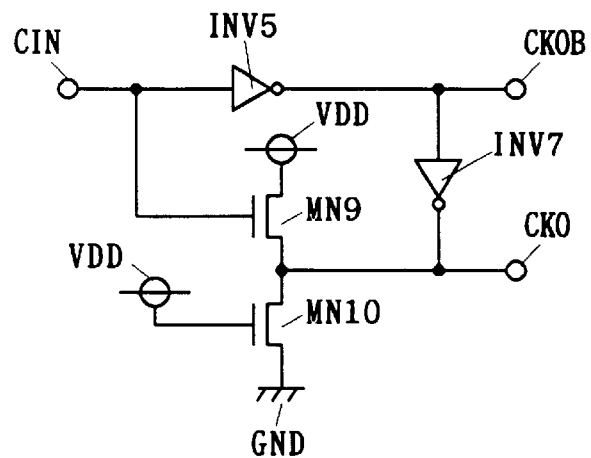
FIG. 22

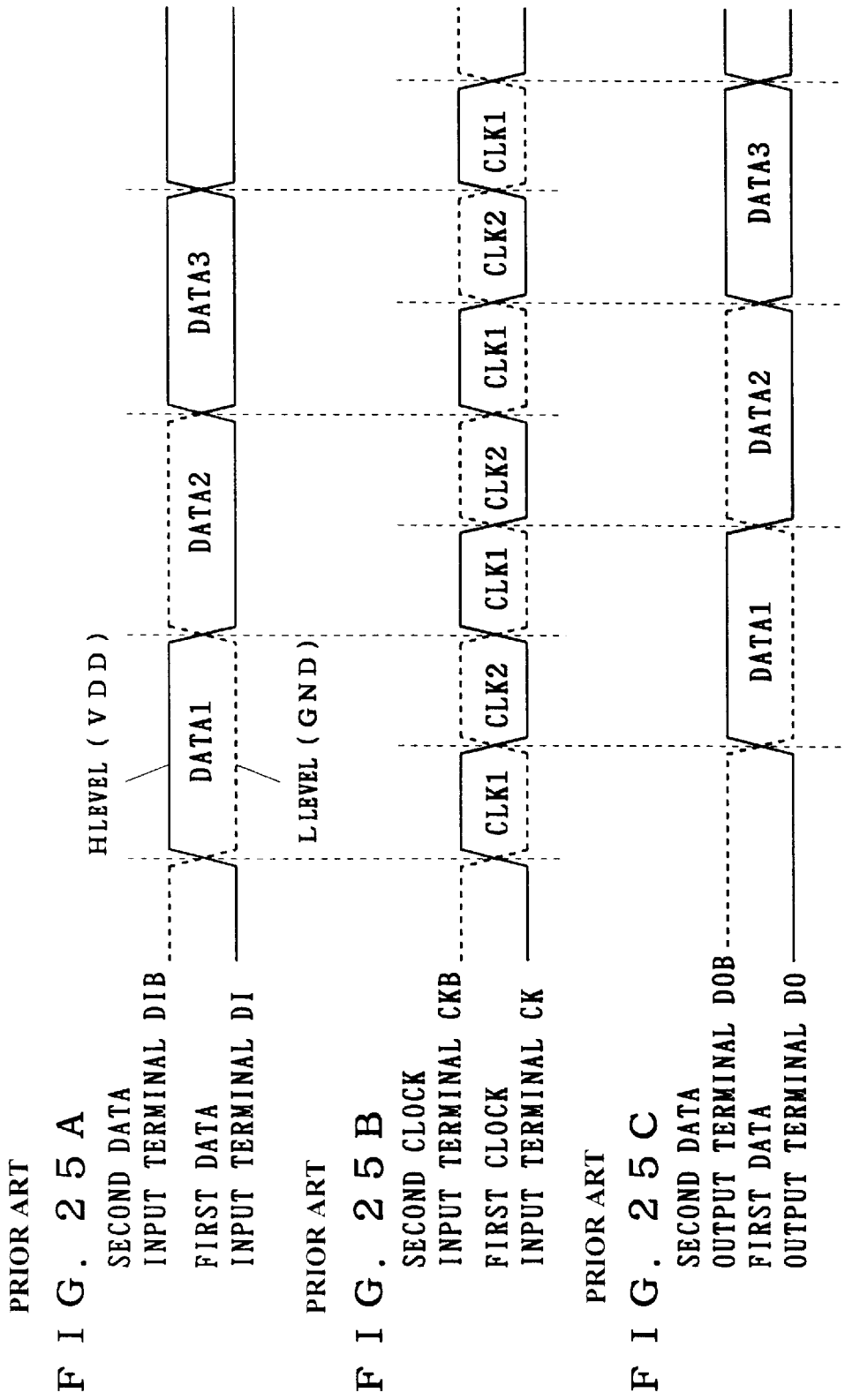

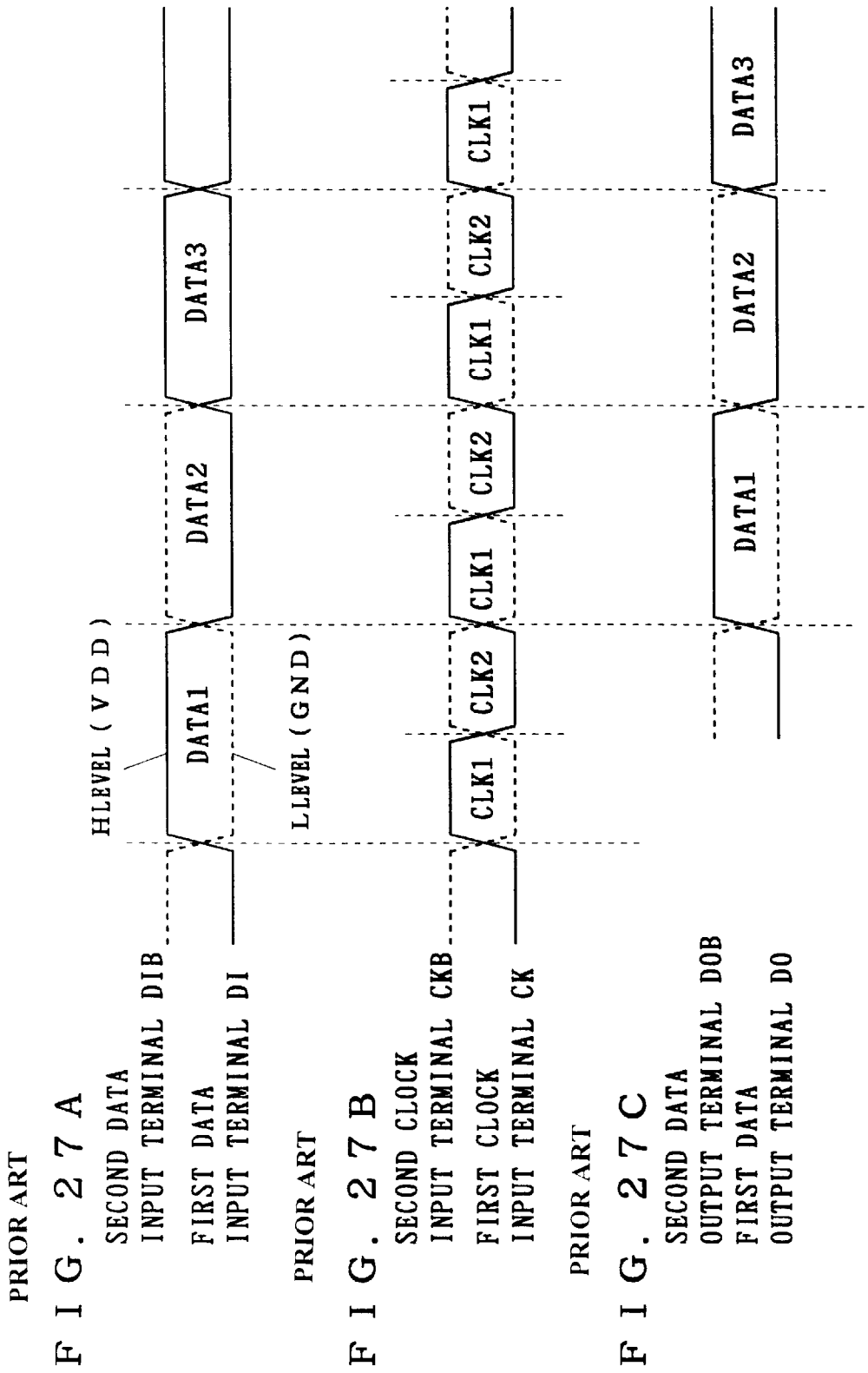

PRIOR ART
FIG. 28
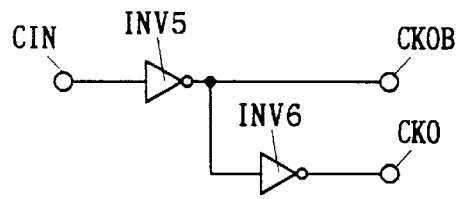
PRIOR ART
FIG. 29A
SIGNAL INPUT
TERMINAL CIN
PRIOR ART
FIG. 29B
SECOND SIGNAL
OUTPUT TERMINAL CKOB
PRIOR ART
FIG. 29C
FIRST SIGNAL
OUTPUT TERMINAL CKO
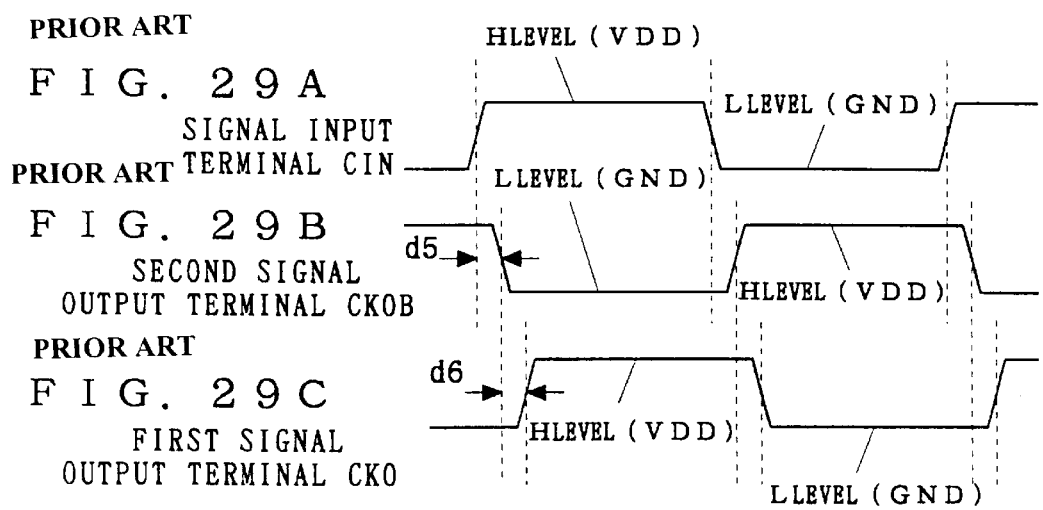

DATA HOLDING CIRCUIT AND BUFFER CIRCUIT

This application is a Continuation of application Ser. No. 08/744,826, filed on Nov. 6, 1996, now abandoned.

BACKGROUND OF THE INVENTION

1. Field of the Invention

The present invention relates to a semiconductor integrated circuit. More particularly, the invention relates to a latch circuit and a flip-flop circuit which are data holding circuits using MOS transistors. The present invention also relates to a buffer circuit for use to input a signal to the data holding circuits.

2. Description of the Background Art

FIG. 24 is a circuit diagram of a conventional latch circuit. The latch circuit is shown as comprising transmission gates TG1 to TG4, inverter gates INV1 and INV2, first and second data input terminals DI and DIB, first and second clock input terminals CK and CKB, and first and second data output terminals DO and DOB.

The elements constituting the latch circuit will be described below. Each of the transmission gates TG1 to TG4 includes a PMOS transistor and an NMOS transistor which are connected in parallel and which have commonly connected source electrodes and commonly connected drain electrodes to form two current electrodes. Gate electrodes of the PMOS transistors of the transmission gates TG1 and TG2, and gate electrodes of the NMOS transistors of the transmission gates TG3 and TG4 are commonly connected to the first clock input terminal CK. Gate electrodes of the NMOS transistors of the transmission gates TG1 and TG2, and gate electrodes of the PMOS transistors of the transmission gates TG3 and TG4 are commonly connected to the second clock input terminal CKB.

The first data input terminal DI is connected to a first current electrode of the transmission gate TG1. A second current electrode of the transmission gate TG1 is connected to an input terminal of the inverter gate INV2 and is also connected to an output terminal of the inverter gate INVL through the transmission gate TG3.

Likewise, the second data input terminal DIB is connected to a first current electrode of the transmission gate TG2. A second current electrode of the transmission gate TG2 is connected to an input terminal of the inverter gate INV1 and is also connected to an output terminal of the inverter gate INV2 through the transmission gate TG4. The output terminals of the inverter gates INV1 and INV2 are connected to the first and second data output terminals DO and DOB, respectively.

Signals to be inputted to the latch circuit are described below. A signal at H level (high level, voltage level of a first power supply VDD) and a signal at L level (low level, voltage level of a second power supply GND) are mutually exclusively applied to the first data input terminal DI and the second data input terminal DIB. The signals at H and L levels different from each other are those at voltage levels indicative of opposite binary logics.

A data combination wherein data signals to be applied to the first and second data input terminals DI and DIB are at H and L levels respectively is referred to as first data DATA1. Similarly, a data combination wherein the data signals to be applied to the first and second data input terminals DI and DIB are at L and H levels respectively is referred to as second data DATA2.

Likewise, a signal at H level and a signal at L level are mutually exclusively applied to the first and second clock input terminals CK and CKB.

A data combination wherein clock signals to be applied to the first and second clock input terminals CK and CKB are at H and L levels respectively is referred to as a first clock input state CLK1. Similarly, a data combination wherein the clock signals to be applied to the first and second clock input terminals CK and CKB are at L and H levels respectively is referred to as a second clock input state CLK2.

The latch circuit has the above described connection and arrangement. Thus, the transmission gates TG1 and TG2 form a pair, and the transmission gates TG3 and TG4 form a pair. The two pairs are mutually exclusively in and out of conduction.

A series of circuit operations of the latch circuit are discussed below. Signal setting for determining the circuit operations (1) to (4) of the latch circuit will be described below. Signal setting numbers correspond respectively to circuit operation numbers.

Signal setting (1)

The latch circuit is in the first clock input state CLK1, and receives the first data DATA1.

Signal setting (2)

The latch circuit is in the second clock input state CLK2, and receives the first data DATA1.

Signal setting (3)

The latch circuit is in the first clock input state CLK1, and receives the second data DATA2.

Signal setting (4)

The latch circuit is in the second clock input state CLK2, and receives the second data DATA2.

FIGS. 25A to 25C are waveform charts representing a timing chart of the circuit operations (1) to (4) of the latch circuit in response to the signal settings (1) to (4). FIG. 25A shows the signal levels at the first and second data input terminals DI and DIB, FIG. 25B shows the signal levels at the first and second clock input terminals CK and CKB, and FIG. 25C shows the signal levels at the first and second data output terminals DO and DOB. The latch circuit functions to receive the data signals at the first and second data input terminals DI and DIB in synchronism with the clock signals to output the data signals which are phase-shifted by a half cycle of the clock signals, as will be described below with reference to FIGS. 25A to 25C.

1. Circuit operation (1) of latch circuit

The transmission gates TG1 and TG2 are off whereas the transmission gates TG3 and TG4 are on. Thus, the signals at the H and L levels applied respectively to the first and second data input terminals DI and DIB are not provided to the interior of the latch circuit.

2. Circuit operation (2) of latch circuit

The transmission gates TG1 and TG2 are on whereas the transmission gates TG3 and TG4 are off.

The signal at H level applied to the first data input terminal DI is applied to the inverter gate INV2 through the transmission gate TG1. In response to this signal, the inverter gate INV2 outputs a signal at L level through the second data output terminal DOB. Likewise, the inverter gate INV1 receives the signal at L level at the second data input terminal DIB through the transmission gate TG2 to output a signal at H level through the first data output terminal DO. Therefore, the first and second data output terminals DO and DOB output the first data DATA1.

3. Circuit operation (3) of latch circuit

The transmission gates TG1 and TG2 are off whereas the transmission gates TG3 and TG4 are on. Thus, the first and second data input terminals DI and DIB and the input terminals of the inverter gates INV2 and INV1 are isolated from each other by the transmission gates TG1 and TG2 which are off, respectively. Specifically, although the data DATA2 are applied to the first and second data input terminals DI and DIB, the signals at L and H levels are continuously applied to the input terminals of the inverter gates INV1 and INV2 respectively in a loop formed by the inverter gates INV1, INV2 and the transmission gates TG3, TG4 which are on. Therefore, the first data DATA1 are outputted continuously.

4. Circuit operation (4) of latch circuit

The transmission gates TG1 and TG2 are on, and the inverter gates INV1 and INV2 are electrically connected to the second and first data input terminals DIB and DI, respectively. The inverter gates INV1 and INV2 receive the signals at H and L levels to output signals at L and H levels through the first and second data output terminals DO and DOB, respectively. Therefore, the first and second data output terminals DO and DOB output the second data DATA2.

Subsequently, the first and second clock states CLK1 and CLK2 are alternately repeated in similar manner, and third data DATA3 phase-shifted by a half clock cycle are transmitted through the latch circuit.

A conventional flip-flop circuit will be described below which is provided by connecting two latch circuits shown in FIG. 24. FIG. 26) is a circuit diagram of a flip-flop circuit disclosed in "IEICE TRANSACTIONS on Electronics, vol. E78-C, No. 12, Dec. 1995, pp.1746–1753".

The flip-flop circuit of FIG. 26 comprises transmission gates TG1 to TG8, inverter gates INV1 to INV4, first and second data input terminals DI and DIB, first and second clock input terminals CK and CKB, and first and second data output terminals DO and DOB.

A process for connecting two latch circuits together is discussed below. As illustrated in FIG. 26, a first latch circuit comprises the transmission gates TG1 to TG4 and the inverter gates INV1 and INV2, and has the same connections of the elements as the latch circuit of FIG. 24. A second latch circuit comprises the transmission gates TG5 to TG8 and the inverter gates INV3 and INV4 which are connected in corresponding relation to the transmission gates TG1 to TG4 and the inverter gates INV1 and INV2, respectively.

The first and second data output terminals of the first latch circuit are connected to the first and second data input terminals of the second latch circuit, respectively. The first and second data input terminals DI and DIB of the first latch circuit serve as the first and second data input terminals DI and DIB of the flip-flop circuit, respectively.

Similarly, the first and second data output terminals DO and DOB of the second latch circuit serve as the first and second data output terminals DO and DOB of the flip-flop circuit, respectively.

The first clock input terminal of the first latch circuit and the second clock input terminal of the second latch circuit are commonly connected to serve as the first clock input terminal CK of the flip-flop circuit. The second clock input terminal of the first latch circuit and the first clock input terminal of the second latch circuit are commonly connected to serve as the second clock input terminal CKB of the flip-flop circuit.

The flip-flop circuit is constructed as above described. Thus, the transmission gates TG1, TG2, TG7, TG8 simultaneously turn on and off, and the transmission gates TG3 to TG6 simultaneously turn on and off in exclusive relation to the transmission gates TG1, TG2, TG7, TG8.

The operation of the flip-flop circuit will be described on the basis of the above-mentioned signal settings (1) to (4). FIGS. 27A to 27C are waveform charts representing a timing chart of the flip-flop circuit and illustrate the same signals as those of FIGS. 25A to 25C.

The clock input states and corresponding data input states in the latch circuit are identical for each signal setting with those in the flip-flop circuit. Thus, the circuit operation of the first latch circuit is identical with that of the above described latch circuit. Accordingly, the second latch circuit and the flip-flop circuit including the first and second latch circuits are mainly described below, with the description of unnecessary portions of the first latch circuit dispensed with.

1. Circuit operation (1) of flip-flop circuit: Signal setting (1)

The transmission gates TG1, TG2, TG7, TG8 are off whereas the transmission gates TG3 to TG6 are on. Since the transmission gates TG1 and TG2 are off, the signals at the first and second data input terminals DI and DIB are not transmitted to the second latch circuit.

2. Circuit operation (2) of flip-flop circuit: Signal setting (2)

The transmission gates TG1, TG2, TG7, TG8 are on whereas the transmission gates TG3 to TG6 are off.

The signal at H level applied to the first data input terminal DI is fed to the inverter gate INV2 through the transmission gate TG1. In response to this signal, the inverter gate INV2 outputs a signal at L level to the second latch circuit. However, since the transmission gate TG6 is off, the output signal from the inverter gate INV2 is not applied to the input terminal of the inverter gate INV3.

Similarly, the inverter gate INV1 receives the signal at L, level at the second data input terminal DIB through the transmission gate TG2 to output a signal at H level. However, since the transmission gate TG5 is off, the output signal from the inverter gate INV1 is not applied to the inverter gate INV4.

3. Circuit operation (3) of flip-flop circuit: Signal setting (3) The transmission gates TG1, TG2, TG7, TG8 are off whereas the transmission gates TG3 to TG6 are on. Specifically, the second latch circuit is in the state of the circuit operation (2) of the latch circuit. The transmission gates TG5 and TG6 are on to permit the signals at H and L levels from the inverter gates INV1 and INV2 to be applied to the inverter gates INV4 and INV3, respectively. Thus, the first and second data output terminals DO and DOB output the first data DATA1.

In the latch circuit, the first and second data output terminals DO and DOB thereof output the first data DATA1 in the circuit operation (2) of the latch circuit. It is hence appreciated that the output from the flip-flop circuit further lags by a half clock cycle behind the output from the latch circuit.

4. Circuit operation (4) of flip-flop circuit: Signal setting (4)

The transmission gates TG1, TG2, TG7, TG8 are on whereas the transmission gates TG3 to TG6 are off. The second latch circuit is in the state of the circuit operation (3) of latch circuit.

In the second latch circuit, the transmission gates TG5 and TG6 are off and the transmission gates TG7 and TG8 are on.

Thus, the output terminals of the inverter gates INV2 and INV1 are isolated from the input terminals of the inverter gates INV3 and INV4 by the transmission gates TG6 and TG5, respectively.

The inverter gates INV3 and INV4 and the transmission gates TG7 and TG8 which are on form a loop wherein the signals at L and H levels are continuously applied to the input terminals of the inverter gates INV3 and INV4, respectively. Thus, the first and second data output terminals DO and DOB continuously output the first data DATA1.

Subsequently, the first and second clock states CLK1 and CLK2 are alternately repeated in similar manner, and the third data DATA3 phase-shifted by one clock cycle are transmitted through the flip-flop circuit. It will be understood from the comparison between FIGS. 27C and 25C that the flip-flop circuit functions to receive the data signals at the data input terminals in synchronism with the clock signals, to temporarily hold the data signals, and to output the data signals phase-shifted by 2 operations of the latch circuit.

In other words, the flip-flop circuit and the latch circuit have the same function of receiving the data signal in synchronism with the clock signal and outputting the phase-shifted data signal. However, a phase difference of one operation of the latch circuit exists between the flip-flop circuit and the latch circuit.

FIG. 28 illustrates a buffer circuit for applying a clock signal or a data signal to the flip-flop circuit or the latch circuit. The buffer circuit is shown as comprising a signal input terminal CIN, an inverter gate INV5 having an input terminal connected to the signal input terminal CIN, a first signal output terminal CKO connected to an output terminal of the inverter gate INV5 through an inverter gate INV6, and a second signal output terminal CKOB connected to the output terminal of the inverter gate INV5.

The circuit operation of the buffer circuit is described below. When a signal at H level is applied to the signal input terminal CIN, the first signal output terminal CKO outputs a signal at H level through the two inverter gates INV5 and INV6, and the second signal output terminal CKOB outputs a signal at L level through the one inverter gate INV5. Likewise, when a signal at L level is applied to the signal input terminal CIN, the first signal output terminal CKO outputs a signal at L level, and the second signal output terminal CKOB outputs a signal at H level. In this manner, the buffer circuit produces two signals which are logically opposite with each other in response to the input signal.

In the above described flip-flop circuit or the latch circuit, signals are applied through the buffer circuit to the first and second data input terminals DI and DIB or the first and second clock input terminals CK and CKB. To use the buffer circuit for the flip-flop circuit as a clock buffer circuit for a clock signal, four PMOS transistors and four NMOS transistors are connected to the output terminals of the clock buffer circuit, respectively. To use the buffer circuit for the latch circuit as the clock buffer circuit for the clock signal, two PMOS transistors and two NMOS transistors are connected to the output terminals of the clock buffer circuit, respectively.

FIGS. 29A to 29C are waveform charts representing a timing chart of the buffer circuit, and illustrate signal levels at the signal input terminal CIN, the second signal output terminal CKOB, and the first signal output terminal CKO, respectively. A switching delay d5 of the inverter gate INV5 and a switching delay d6 of the inverter gate INV6 are shown in FIGS. 29B and 29C.

As depicted in FIGS. 29A to 29C, after the input signal was applied to the signal input terminal CIN, the second signal output terminal CKOB provides the output signal with the switching delay d5 and the first signal output terminal CKO provides the output signal with a switching delay d5+d6.

As above stated, the conventional latch circuit includes the four PMOS and NMOS transistor pairs constituting the respective transmission gates. Similarly, the conventional flip-flop circuit includes the eight PMOS and NMOS transistor pairs constituting the respective transmission gates.

Such arrangements are disadvantageous because of increased areas of the conventional latch and flip-flop circuits.

When the clock buffer circuit is connected to the flip-flop circuit, the four PMOS transistors and four NMOS transistors are connected to the first and second signal output terminals CKO and CKOB of the clock buffer circuit, respectively. When the clock buffer circuit is connected to the latch circuit, the two PMOS transistors and two NMOS transistors are connected to the first and second signal output terminals CKO and CKOB of the clock buffer circuit, respectively.

This excessively increases the load capacitance of the output terminals of the clock buffer circuit, causing the clock buffer circuit to consume a large amount of power during charging and discharging of the load capacitance.

Further, the conventional buffer circuit, wherein the number of inverter gates connected between the signal input terminal CIN and the first signal output terminal CKO is different from the number of inverter gates connected between the signal input terminal CIN and the second signal output terminal CKOB, causes a time delay between the signals outputted from the first and second signal output terminals CKO and CKOB. Additionally, two inverter gates between the first signal output terminal CKO and the signal input terminal CIN have a delay causing a corresponding signal output delay, resulting in low operating speed of the flip-flop circuit or latch circuit.

SUMMARY OF THE INVENTION

According to a first aspect of the present invention, a data holding circuit comprises: first and second signal input terminals; first and second clock terminals; first and second transistors of a first conductivity type having control terminals connected to the second clock terminal, and first current electrodes connected to the first and second signal input terminals, respectively; third and fourth transistors of the first conductivity type having control terminals connected to the first clock terminal, and first current electrodes connected to second current electrodes of the first and second transistors, respectively; a first signal inverting circuit having an input terminal connected to the second current electrode of the second transistor, and an output terminal connected to a second current electrode of the third transistor; a second signal inverting circuit having an input terminal connected to the second current electrode of the first transistor, and an output terminal connected to a second current electrode of the fourth transistor; a fifth transistor of a second conductivity type having a control terminal connected to the input terminal of the second signal inverting circuit, a first current electrode connected to the input terminal of the first signal inverting circuit, and a second current electrode connected to a first constant potential terminal; and first and second signal output terminal connected to the output terminals of the first and second signal inverting circuits, respectively, wherein first and second potentials lie within first and second potential bands isolated from each other, respectively, wherein mutually different two logics of binary logics are contained in the first and second potential bands, respectively, the first and second signal input terminals receiving the first and second potentials in mutually exclusive relation, the first and second clock terminals receiving potentials lying respectively within the first and second potential bands in mutually exclusive relation, wherein a transistor of the first conductivity type turns on and off in response to potentials lying within the first and second potential bands applied at its control terminal, respectively, wherein a transistor of the second conductivity type turns off and on in response to potentials lying within the first and second potential bands applied at its control terminal, respectively, the first constant potential terminal providing a potential which is farther from the second potential than the first potential is or is equal to the first potential.

Preferably, according to a second aspect of the present invention, the data holding circuit further comprises: a sixth transistor of the second conductivity type having a control terminal connected to the input terminal of the first signal inverting circuit, a first current electrode connected to the input terminal of the second signal inverting circuit, and a second current electrode connected to a second constant potential terminal, the second constant potential terminal providing a potential which is farther from the second potential than the first potential is or is equal to the first potential.

According to a third aspect of the present invention, a data holding circuit comprises: a first data holding circuit which is the data holding circuit recited in the second aspect, and a second data holding circuit including: first and second transistors of the first conductivity type having control terminals connected to the first clock terminal, and first current electrodes connected to the first and second signal output terminals of the first data holding circuit, respectively; third and fourth transistors of the first conductivity type having control terminals connected to the second clock terminal, and first current electrodes connected to second current electrodes of the first and second transistors of the second data holding circuit, respectively; a first signal inverting circuit having an input terminal connected to the second current electrode of the second transistor of the second data holding circuit, and an output terminal connected to a second current electrode of the third transistor of the second data holding circuit; a second signal inverting circuit having an input terminal connected to the second current electrode of the first transistor of the second data holding circuit, and an output terminal connected to a second current electrode of the fourth transistor of the second data holding circuit; a fifth transistor of the second conductivity type having a control terminal connected to the input terminal of the second signal inverting circuit of the second data holding circuit, a first current electrode connected to the input terminal of the first signal inverting circuit of the second data holding circuit, and a second current electrode connected to a third constant potential terminal; first and second signal input terminals connected to the output terminals of the first and second signal inverting circuits of the second data holding circuit, respectively; and a sixth transistor of the second conductivity type having a control terminal connected to the input terminal of the first signal inverting circuit of the second data holding circuit, a first current electrode connected to the input terminal of the second signal inverting circuit of the second data holding circuit, and a second current electrode connected to a fourth constant potential terminal, the third constant potential terminal providing a potential which is farther from the second potential than the first potential is or is equal to the first potential, the fourth constant potential terminal providing a potential which is farther from the second potential than the first potential is or is equal to the first potential.

According to a fourth aspect of the present invention, a buffer circuit comprises: a signal input terminal for selectively receiving one of first and second potentials which are different from each other to provide binary logics; a first inverter including a first transistor of a first conductivity type, and a second transistor of a second conductivity type, the first and second transistors having control terminals connected to the signal input terminal, first current electrodes connected to each other, and second current electrodes connected to first and second potential terminals providing the first and second potentials, respectively; a source follower circuit including a third transistor of the second conductivity type having a control terminal connected to the signal input terminal, a first current electrode connected to a third potential terminal providing the second potential through a resistance object, and a second current electrode connected to a fourth potential terminal providing the first potential; and first and second signal output terminals connected to the first current electrode of the third transistor and the first current electrode of the first transistor, respectively, wherein a transistor of the first conductivity type turns off and on in response to the first and second potentials applied at its control terminal, respectively, and wherein a transistor of the second conductivity type turns on and off in response to the first and second potentials applied at its control terminal, respectively.

Preferably, according to a fifth aspect of the present invention, the resistance object is a fourth transistor of the second conductivity type having a control terminal receiving the first potential, a first current electrode connected to the first current electrode of the third transistor, and a second current electrode connected to the third potential terminal.

Preferably, according to a sixth aspect of the present invention, the resistance object is a fourth transistor of the first conductivity type having a control terminal connected to the signal input terminal, a first current electrode connected to the first current electrode of the third transistor, and a second current electrode connected to the third potential terminal.

Preferably, according to a seventh aspect of the present invention, the buffer circuit further comprises: a second inverter having an input terminal connected to the second signal output terminal, and an output terminal connected to the first signal output terminal.

In accordance with the arrangement of the first aspect of the present invention, the data holding circuit which comprises the six transistors required for circuit operation except the signal inverting circuits has an area smaller than that of the conventional circuit.

When the first potential is applied to the input of the first signal inverting circuit through the second signal input terminal and second transistor and the second potential is applied to the input of the second signal inverting circuit through the first signal input terminal and first transistor, the fifth transistor turns on to apply the constant potential to the input terminal of the first signal inverting circuit. This permits the input terminal of the first signal inverting circuit to receive the potential sufficiently far from the logical threshold voltage of the signal inverting circuit if a voltage drop occurs by the amount of the transistor threshold value in the second transistor. Thus, the highly reliable data holding circuit with stable circuit operation is achieved if the data holding circuit includes a smaller number of transistors required for circuit operation.

The arrangement in accordance with the second aspect of the present invention permits the input terminal of the second signal inverting circuit to receive the potential sufficiently far from the logical threshold value of the signal inverting circuit through the sixth transistor in addition to the effects of the first aspect. This further stabilizes the circuit operation.

In accordance with the third aspect of the present invention, the use of the data holding circuit of the second aspect provides the highly reliable flip-flop circuit with a small area and a stable circuit operation.

In accordance with the fourth aspect of the present invention, the source follower circuit and the first inverter are provided between the signal input terminal and the first and second signal output terminals, respectively. Then, a delay between the signals outputted from the first and second signal output terminals is determined by the difference in output characteristics with time between the source follower circuit and the first inverter. The source follower circuit includes the third transistor and the resistor which are connected in parallel, and the first inverter includes the first and second transistors connected in parallel. Thus, there is a resemblance in output characteristics with time between the source follower circuit and the inverter. The signals outputted from the first and second signal output terminals, accordingly, are substantially in synchronism with each other.

Particularly, connecting the first and second signal output terminals of the fourth aspect to the first and second clock terminals of the first to third aspects allows the clock signal to be applied to the arrangement of the first to third aspects.

In accordance with the fifth and sixth aspects of the present invention, the source follower circuit includes two transistors, that is, the third and fourth transistors. These transistors may be formed simultaneously during the fabrication step of forming transistors. This facilitates the fabrication steps of the buffer circuit.

Particularly in the sixth aspect, the third and fourth transistors of the source follower circuit turn on and off in mutually exclusive relation. Thus, both of the third and fourth transistors are not on simultaneously. This prevents the potential at the first signal output terminal from becoming dull, improving the reliability of the buffer circuit.

In accordance with the seventh aspect of the present invention, when the first potential is applied to the signal input terminal, the source follower circuit first causes the first signal output terminal to provide the potential close to the first potential, and thereafter the second inverter causes the first signal output terminal to provide the first potential.

In the arrangement of the seventh aspect, particularly described also in the sixth aspect, when the second potential is applied to the signal input terminal, the first signal output terminal first provides the potential close to the second potential, and thereafter provides the second potential on the basis of the similar principle. This further improves the reliability of the buffer circuit.

It is therefore an object of the present invention to provide a highly reliable data holding circuit with a reduced circuit area.

It is another object of the invention to provide a buffer circuit which provides synchronized output signals having a short delay.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a circuit diagram of a second arrangement of the first preferred embodiment;

FIGS. 15A to 15C are waveform charts representing a timing chart of the arrangement of FIG. 14;

FIG. 16 is a circuit diagram of a fourth arrangement of the third preferred embodiment;

FIGS. 21A to 21C are waveform charts representing a timing chart of the arrangement of FIG. 20;

FIG. 22 is a circuit diagram of a second arrangement of the fifth preferred embodiment;

FIGS. 25A to 25C are waveform charts representing a timing chart of the conventional latch circuit;

FIG. 26 is a circuit diagram of a conventional flip-flop circuit;

FIGS. 27A to 27C are waveform charts representing a timing chart of the conventional flip-flop circuit;

FIG. 28 is a circuit diagram of a conventional buffer circuit; and

FIGS. 29A to 29C are waveform charts representing a timing chart of the conventional buffer circuit.

DESCRIPTION OF THE PREFERRED EMBODIMENTS

First Preferred Embodiment

Figure 1:
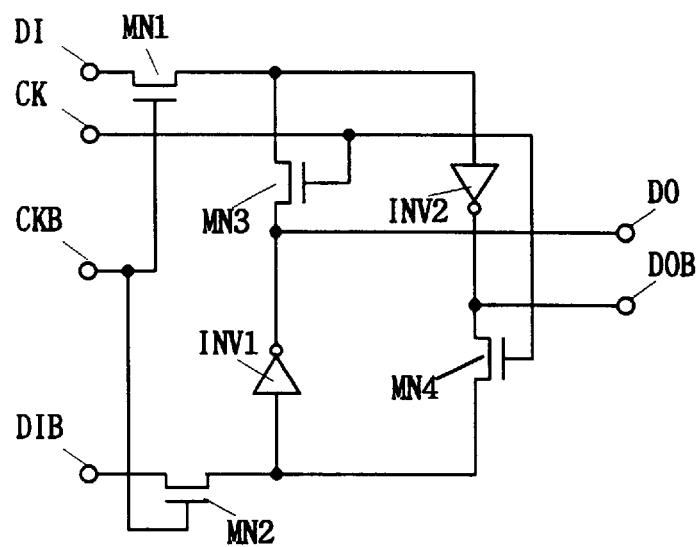
FIG. 1 is a circuit diagram of a first arrangement of a first preferred embodiment according to the present invention.

FIG. 1 is a circuit diagram of a latch circuit according to a first preferred embodiment of the present invention. The latch circuit is shown as comprising NMOS transistors MN1 to MN4, inverter gates INV1 and INV2, first and second data input terminals DI and DIB, first and second clock input terminals CK and CKB, and first and second data output terminals DO and DOB.

The elements constituting the latch circuit are described below. Gate electrodes of the NMOS transistors MN3 and MN4 are commonly connected to the first clock input terminal CK. Gate electrodes of the NMOS transistors MN1 and MN2 are commonly connected to the second clock input terminal CKB.

The first data input terminal DI is connected to a drain electrode of the NMOS transistor MN1. A source electrode of the NMOS transistor MN1 is connected to an input terminal of the inverter gate INV2 and is also connected to an output terminal of the inverter gate INV1 through drain and source electrodes of the NMOS transistors MN3.

Similarly, the second data input terminal DIB is connected to a drain electrode of the NMOS transistor MN2. A source electrode of the NMOS transistor MN2 is connected to an input terminal of the inverter gate INV1 and is also connected to an output terminal of the inverter gate INV2 through drain and source electrodes of the NMOS transistor MN4. The output terminals of the inverter gates INV1 and INV2 are connected to the first and second data output terminals DO and DOB, respectively.

Figure 24:
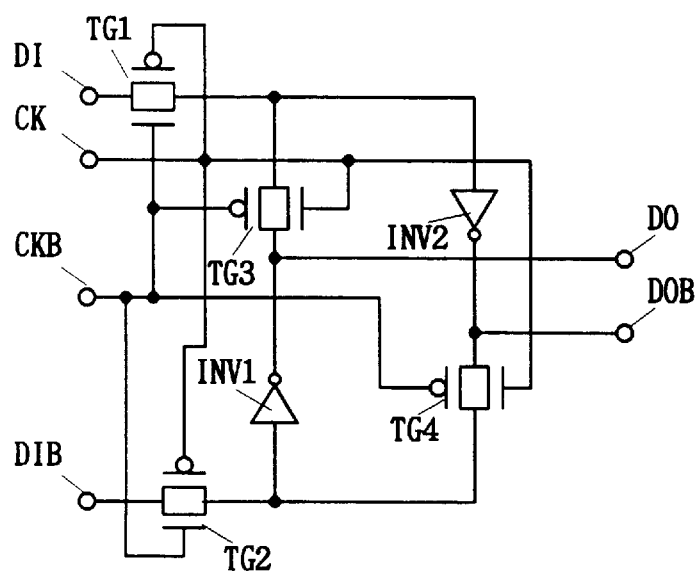
FIG. 24 is a circuit diagram of a conventional latch circuit.
Figure 2:
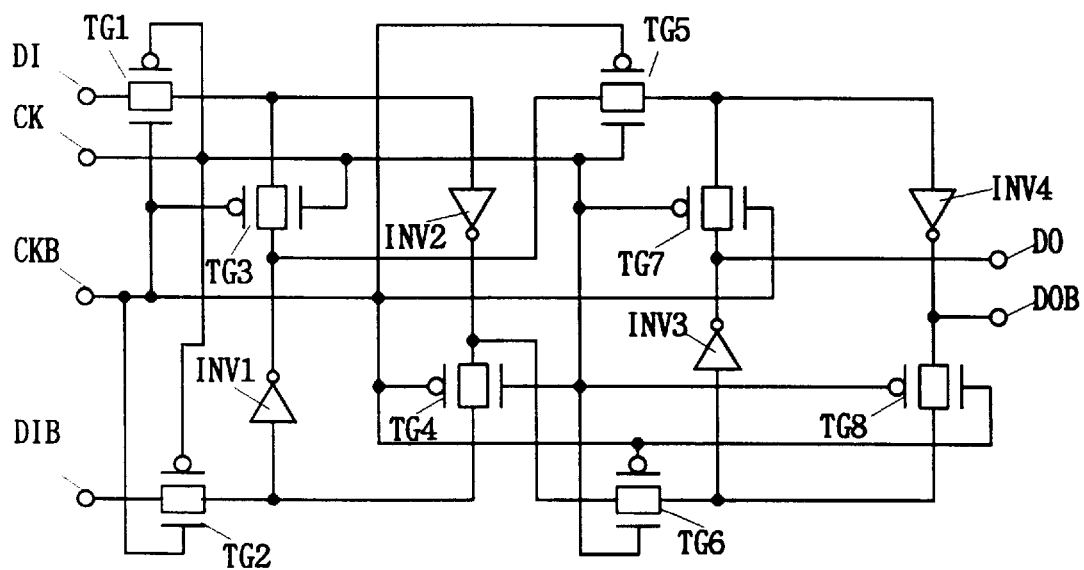

In other words, the latch circuit of FIG. 1 is constructed such that the PMOS transistors forming the transmission gates TG1 to TG4 and connecting lines thereof are removed from the conventional latch circuit of FIG. 24.

Figure 2:
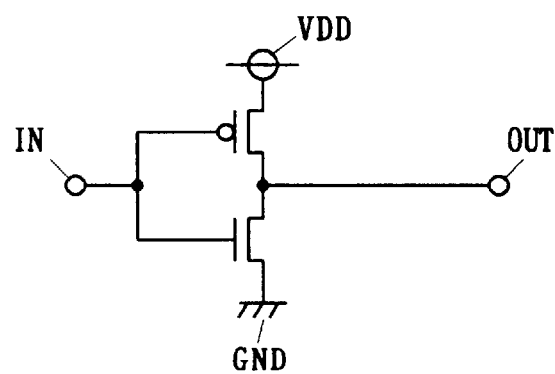
FIG. 2 is a circuit diagram of an inverter gate.

FIG. 2 is a circuit diagram of each of the inverter gates INV1 and INV2 for use in the latch circuit of FIG. 1. As shown in FIG. 2, the inverter gate includes a PMOS transistor and an NMOS transistor which are drain-to-drain connected in series between a first power supply VDD and a second power supply GND, an input terminal IN commonly connected to gate electrodes of the PMOS and NMOS transistors, and an output terminal OUT commonly connected to the drain electrodes of the PMOS and NMOS transistors.

The absolute value of the threshold voltage of the NMOS transistors MN1 and MN2 is a voltage Vthn. Thus, the potential of a signal passing through the NMOS transistors MN1 and MN2 drops by the amount of the voltage Vthn.

The first power supply VDD supplies a potential VDD, and the second power supply GND supplies a potential GND. The inverter gates INV1 and INV2 output a signal at H level (the potential VDD) if an input thereto is lower than the logical threshold potential thereof, and output a signal at L level (the potential GND) if the input is higher than the logical threshold potential thereof. The logical threshold potential of the inverter gates INV1 and INV2 is generally set to an intermediate potential between the potential VDD and the potential GND, that is, (VDD+GND)/2. Various conditions are previously established so that the potential VDD−Vthn after the voltage drop is sufficiently higher than the logical threshold potential of the inverter gates.

Signals to be applied to the latch circuit are discussed below. Signals at H and L levels are mutually exclusively applied to the first and second data input terminals DI and DIB. The signals at H and L levels different from each other are those at voltage levels indicative of opposite binary logics.

A data combination wherein data signals to be applied to the first and second data input terminals DI and DIB are at H and L levels respectively is referred to as first data DATA1. Similarly, a data combination wherein the data signals to be applied to the first and second data input terminals DI and DIB are at L and H levels respectively is referred to as second data DATA2.

Likewise, a signal at H level and a signal at L level are mutually exclusively applied to the first and second clock input terminals CK and CKB.

A data combination wherein clock signals to be applied to the first and second clock input terminals CK and CKB are at H and L levels respectively is referred to as a first clock input state CLK1. Similarly, a data combination wherein the clock signals to be applied to the first and second clock input terminals CK and CKB are at L and H levels respectively is referred to as a second clock input state CLK2.

The latch circuit has the above described connection and arrangement. The NMOS transistors MN1 and MN2 form a pair, and the NMOS transistors MN3 and MN4 form a pair. The two pairs are mutually exclusively in and out of conduction.

A series of circuit operations of the latch circuit are discussed below. Signal setting for determining the circuit operations (1) to (4) of the latch circuit will be described below. Signal setting numbers correspond respectively to circuit operation numbers.

Signal setting (1)

The latch circuit is in the first clock input state CLK1, and receives the first data DATA1.

Signal setting (2)

The latch circuit is in the second clock input state CLK2, and receives the first data DATA1.

Signal setting (3)

The latch circuit is in the first clock input state CLK1, and receives the second data DATA2.

Signal setting (4)

The latch circuit is in the second clock input state CLK2, and receives the second data DATA2.

Figure 3:
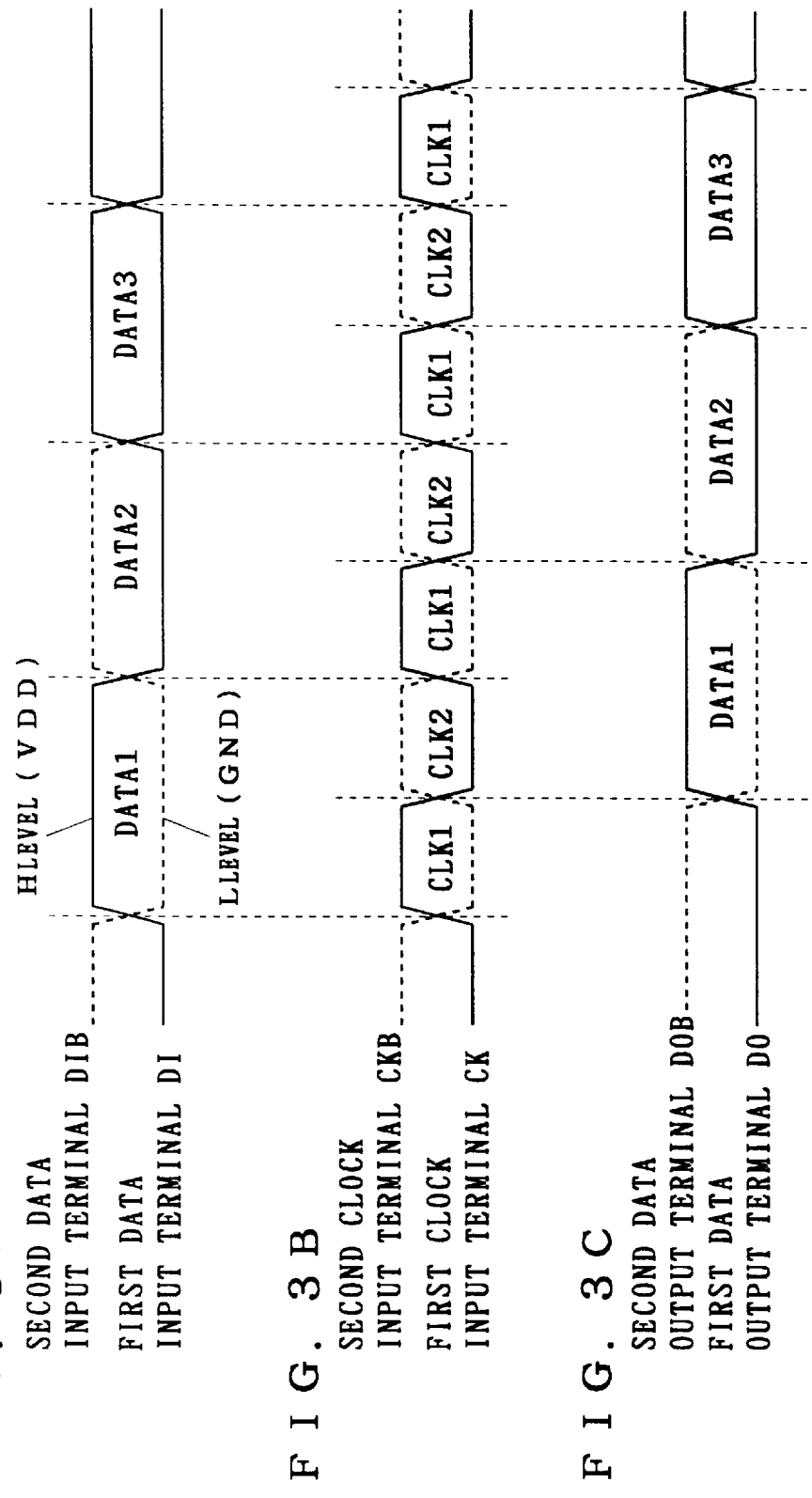
FIGS. 3A to 3C are waveform charts representing a timing chart of the arrangement of FIG. 1.

FIGS. 3A to 3C are waveform charts representing a timing chart of the circuit operations (1) to (4) of the latch circuit in response to the signal settings (1) to (4). FIG. 3A shows the signal potential levels at the first and second data input terminals DI and DIB, FIG. 3B shows the signal potential levels at the first and second clock input terminals CK and CKB, and FIG. 3C shows the signal potential levels at the first and second data output terminals DO and DOB. The levels at the first data input terminal DI, the first clock input terminal CK, and the first data output terminal DO are indicated by solid lines, and the levels at the second data input terminal DIB, the second clock input terminal CKB, and the second data output terminal DOB are indicated by broken lines.

The latch circuit functions to receive the data signals at the first and second data input terminals DI and DIB in synchronism with the clock signals to output the data signals which are phase-shifted by a half cycle of the clock signals in similar manner to the conventional latch circuit, as will be described below with reference to FIGS. 3A to 3C.

1. Circuit operation (1) of latch circuit

The NMOS transistors MN1 and MN2 are off whereas the NMOS transistors MN3 and MN4 are on. Thus, the signals at H and L levels applied respectively to the first and second data input terminals DI and DIB are not provided to the interior of the latch circuit.

2. Circuit operation (2) of latch circuit

The NMOS transistors MN1 and MN2 are on whereas the NMOS transistors MN3 and MN4 are off.

The signal at H level applied to the first data input terminal DI is fed to the inverter gate INV2 through the NMOS transistor MN1. Then, a voltage drop by the amount of the voltage Vthn occurs in the NMOS transistor MN1, and the potential VDD−Vthn is applied to the inverter gate INV2. The previous establishment so that the potential VDD−Vthn is sufficiently higher than the logical threshold potential of the inverter gate allows the inverter gate INV2 to output a signal at L level through the second data output terminal DOB.

The inverter gate INV1 receives the signal at L level at the second data input terminal DIB through the NMOS transistor MN2 to output a signal at H level through the first data output terminal DO. Therefore, the first and second data output terminals DO and DOB output the first data DATA1.

3. Circuit operation (3) of latch circuit

The NMOS transistor MN1 and MN2 are off whereas the NMOS transistors MN3 and MN4 are on. Thus, the first and second data input terminals DI and DIB and the input terminals of the inverter gates INV1 and INV2 are isolated from each other by the NMOS transistors MN1 and MN2 which are off, respectively. Specifically, although the data DATA2 are applied to the first and second data input terminals DI and DIB, a loop is formed by the inverter gates INV1, INV2 and the NMOS transistors MN3, MN4 which are on, and the signals at L and H levels are continuously applied to the input terminals of the inverter gates INV1 and INV2 respectively. Therefore, the first data DATA1 are outputted continuously.

4. Circuit operation (4) of latch circuit

The NMOS transistors MN1 and MN2 are on, and the inverter gates INV1 and INV2 are electrically connected to the second and first data input terminals DIB and DI, respectively. The inverter gates INV1 and INV2 receive the signals at H and L levels through the NMOS transistors MN2 and MN1, respectively.

Thus, the potential VDD−Vthn is applied to the input terminal of the inverter gate INV1. In response to the input state, the inverter gates INV1 and INV2 output signals at L and H levels through the first and second data output terminals DO and DOB, respectively. Therefore, the first and second data output terminals DO and DOB output the second data DATA2.

Subsequently, the first and second clock states CLK1 and CLK2 are alternately repeated in similar manner, and third data DATA3 phase-shifted by a half clock cycle are transmitted through the latch circuit.

The foregoing description is given on the circuit operations (1) to (4) of the latch circuit when the signal at the first data input terminal DI changes from the H level to the L level and the signal at the second data input terminal DIB changes from the L level to the H level, that is, when data change is from the first data DATA1 to the second data DATA2. However, the circuit operations of the latch circuit are not limited to such changes.

In the latch circuit of the first preferred embodiment, the four PMOS transistors of the conventional latch circuit are not provided but the NMOS transistors having a smaller size than the PMOS transistors are used. Therefore, the latch circuit of the first preferred embodiment features its smaller circuit area.

A flip-flop circuit according to the first preferred embodiment will be described below which is provided by connecting two latch circuits shown in FIG. 1. FIG. 4 is a circuit diagram of the flip-flop circuit of the first preferred embodiment.

The flip-flop circuit of FIG. 4 comprises NMOS transistors MN1 to MN8, inverter gates INV1 to INV4, first and second data input terminals DI and DIB, first and second clock input terminals CK and CKB, and first and second data output terminals DO and DOB.

A process for connecting two latch circuits together is discussed below. As illustrated in FIG. 4, a first latch circuit comprises the NMOS transistors MN1 to MN4 and the inverter gates INV1 and INV2, and has the same connections of the elements as the latch circuit of FIG. 1. A second latch circuit comprises the NMOS transistors MN5 to MN8 and the inverter gates INV3 and INV4 which are connected in corresponding relation to the NMOS transistors MN1 to MN4 and the inverter gates INV1 and INV2 in the latch circuit of FIG. 1, respectively.

The first and second data output terminals of the first latch circuit are connected to the first and second data input terminals of the second latch circuit, respectively.

The first and second data input terminals DI and DIB of the first latch circuit serve as the first and second data input terminals DI and DIB of the flip-flop circuit, respectively. Similarly, the first and second data output terminals DO and DOB of the second latch circuit serve as the first and second data output terminals DO and DOB of the flip-flop circuit, respectively.

The first clock input terminal of the first latch circuit and the second clock input terminal of the second latch circuit are commonly connected to serve as the first clock input terminal CK of the flip-flop circuit. The second clock input terminal of the first latch circuit and the first clock input terminal of the second latch circuit are commonly connected to serve as the second clock input terminal CKB of the flip-flop circuit.

In other words, the flip-flop circuit of FIG. 4 is constructed such that the PMOS transistors constituting the transmission gates TG1 to TG8 and connecting lines thereof are removed from the flip-flop circuit of FIG. 26.

The flip-flop circuit is constructed as above described. Thus, the NMOS transistors MN1, MN2, MN7, MN8 simultaneously turn on and off, and the NMOS transistors MN3 to MN6 simultaneously turn on and off in exclusive relation to the NMOS transistors MN1, MN2, MN7, MN8.

Figure 5:
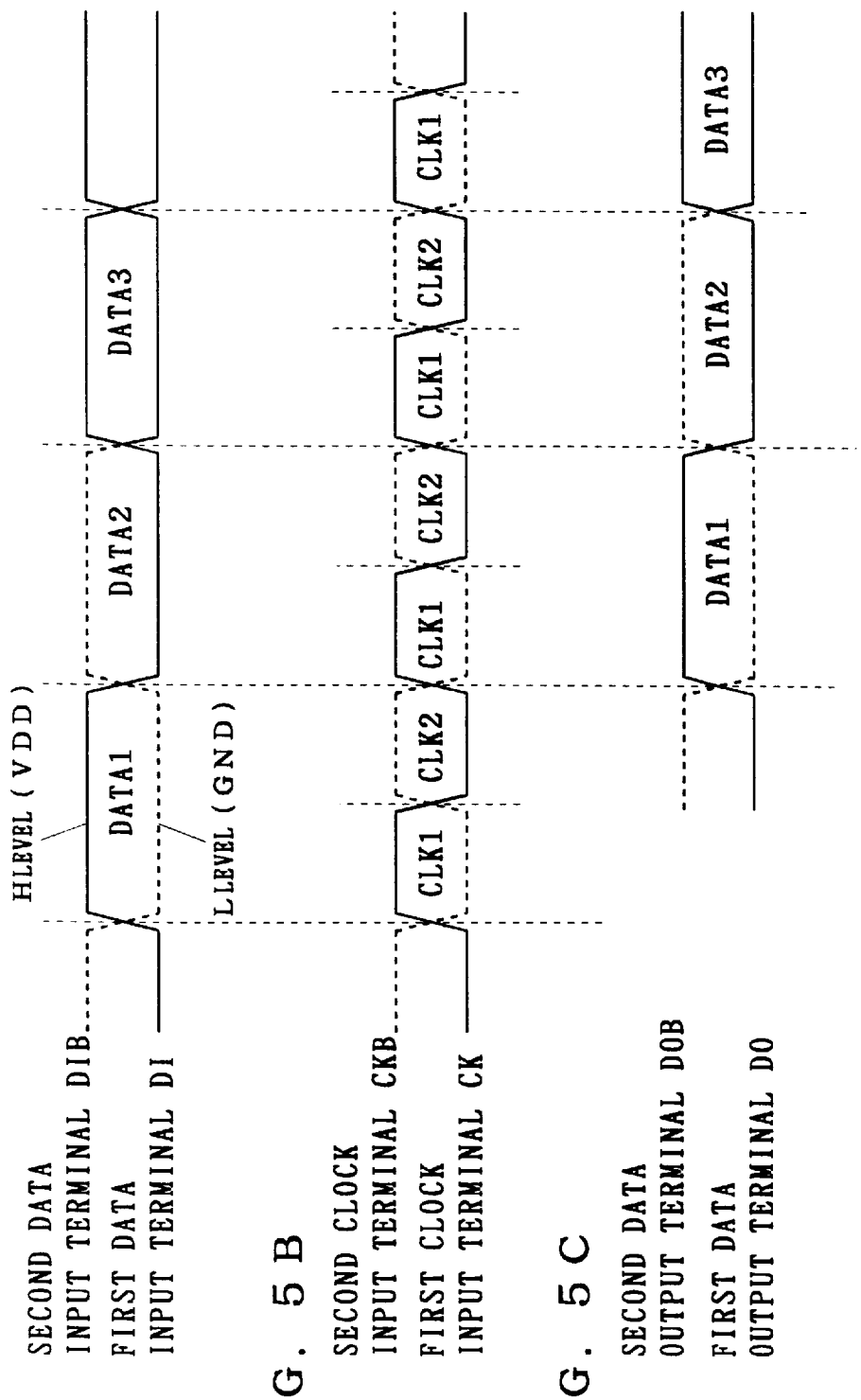
FIGS. 5A to 5C are waveform charts representing a timing chart of the arrangement of FIG. 4.

The operation of the flip-flop circuit will be described on the basis of the above-mentioned signal settings (1) to (4). FIGS. 5A to 5C are waveform charts representing a timing chart of the flip-flop circuit and illustrate the same signals as those of FIGS. 3A to 3C, respectively.

The clock input states and corresponding data input states in the latch circuit are identical for each signal setting with those in the flip-flop circuit. Thus, the circuit operation of the first latch circuit is identical with that of the above described latch circuit. Accordingly, the second latch circuit and the flip-flop circuit including the first and second latch circuits are mainly described below, with the description of unnecessary portions of the first latch circuit dispensed with.

1. Circuit operation (1) of flip-flop circuit: Signal setting (1)

The NMOS transistors MN1, MN2, MN7, MN8 are off whereas the NMOS transistors MN3 to MN6 are on. Since the NMOS transistors MN1 and MN2 are off, the signals at the first and second data input terminals DI and DIB are not transmitted to the second latch circuit.

2. Circuit operation (2) of flip-flop circuit: Signal setting (2)

The NMOS transistors MN1, MN2, MN7, MN8 are on whereas the NMOS transistors MN3 to MN6 are off.

The signal at H level applied to the first data input terminal DI is fed to the inverter gate INV2 through the NMOS transistor MN1. In response to this signal, the inverter gate INV2 outputs a signal at L level to the second latch circuit. However, since the NMOS transistor MN6 is off, the output signal from the inverter gate INV2 is not applied to the input terminal of the inverter gate INV3.

Similarly, the inverter gate INV1 receives the signal at L level at the second data input terminal DIB through the NMOS transistor MN2 to output a signal at H level. However, since the NMOS transistor MN5 is off, the output signal from the inverter gate INV1 is not applied to the inverter gate INV4.

3. Circuit operation (3) of flip-flop circuit: Signal setting (3)

The NMOS transistors MN1, MN2, MN7, MN8 are off whereas the NMOS transistors MN3 to MN6 are on. Specifically, the second latch circuit is in the state of the circuit operation (2) of the latch circuit. The NMOS transistors MN5 and MN6 are on to permit the signals at H and L levels from the inverter gates INV1 and INV2 to be applied to the inverter gates INV4 and INV3, respectively. At this time, the NMOS transistor MN5 applies the signal at the potential VDD−Vthn to the inverter gate INV4. Thus, the first and second data output terminals DO and DOB output the first data DATA1.

In the latch circuit, the first and second data output terminals DO and DOB thereof output the first data DATA1 in the circuit operation (2) of the latch circuit. It is hence appreciated that the output from the flip-flop circuit further lags by a half clock cycle behind the output from the latch circuit.

4. Circuit operation (4) of flip-flop circuit: Signal setting (4)

The NMOS transistors MN1, MN2, MN7, MN8 are on whereas the NMOS transistors MN3 to MN6 are off. The second latch circuit is in the state of the circuit operation (3) of the latch circuit.

In the second latch circuit, the NMOS transistors MN5 and MN6 are off and the NMOS transistors MN7 and MN8 are on. Thus, the output terminals of the inverter gates INV2 and INV1 are isolated from the input terminals of the inverter gates INV3 and INV4 by the NMOS transistors MN6 and MN5, respectively.

The inverter gates INV3 and INV4 and the NMOS transistors MN7 and MN8 which are on form a loop wherein the signals at L and H levels are continuously applied to the input terminals of the inverter gates INV3 and INV4 through the NMOS transistors MN6 and MN5, respectively. The inverter gates INV3 and INV4 continuously output the first data DATA1 through the first and second data output terminals DO and DOB.

Subsequently, the first and second clock states CLK1 and CLK2 are alternately repeated in similar manner, and the third data DATA3 phase-shifted by one clock cycle are transmitted through the flip-flop circuit. It will be understood from the comparison between FIGS. 5C and 3C that the flip-flop circuit functions to receive the data signals applied to the data input terminals in synchronism with the clock signals, to temporarily hold the data signals, and to output the data signals phase-shifted by 2 operations of the latch circuit.

The action of the signals shown in FIGS. 5A to 5C is identical with that of the signals shown in FIGS. 27A to 27C. It is hence understood that the flip-flop circuit of the first preferred embodiment is identical in circuit operation with the conventional flip-flop circuit.

In other words, the flip-flop circuit and the latch circuit have the same function of receiving the data signal in synchronism with the clock signal and outputting the phase-shifted data signal. However, a phase difference of one operation of the latch circuit exists between the flip-flop circuit and the latch circuit.

The flip-flop circuit of the first preferred embodiment wherein the PMOS transistors are omitted from the transmission gates of the conventional flip-flop circuit may accomplish the reduction in circuit area as well as achieving the conventional circuit operation.

This provides a decreased load capacitance for the output terminal of the buffer circuit to be connected to the latch circuit or flip-flop circuit of the first preferred embodiment. Accordingly, the clock buffer circuit consumes a smaller amount of power during charging and discharging of the load capacitance.

Second Preferred Embodiment

A second preferred embodiment may avoid malfunctions of the circuit resulting from the voltage drop caused by the NMOS transistors, and discloses a latch circuit and a flip-flop circuit that are highly reliable.

Figure 6:
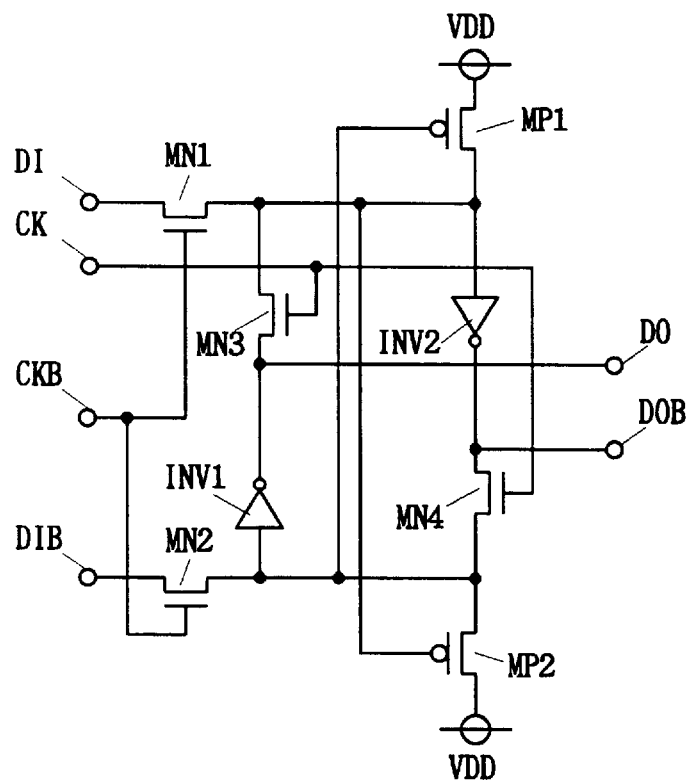
FIG. 6 is a circuit diagram of a first arrangement of a second preferred embodiment according to the present invention.

FIG. 6 is a circuit diagram of the latch circuit according to the second preferred embodiment of the present invention. The latch circuit of the second preferred embodiment further comprises PMOS transistors MP1 and MP2 in addition to the elements of the latch circuit of the first preferred embodiment. The latch circuit will be described below on the basis of the difference between the first and second preferred embodiments.

Gate electrodes of the PMOS transistors MP1 and MP2 are connected to the input terminals of the inverter gates INV1 and INV2, respectively. The PMOS transistors MP1 and MP2 have drain electrodes connected to the input terminals of the inverter gates INV2 and INV1 respectively, and have source electrodes connected to the first power supplies VDD.

It is apparent from the above description that the PMOS transistors MP1 and MP2 are connected symmetrically with respect to the gate and drain electrodes thereof, that is, connected in cross-coupled configuration.

Described below are differences in circuit operation between the latch circuit of the second preferred embodiment achieved by the above described construction and the latch circuit of the first preferred embodiment.

The signals at H and L levels are mutually exclusively applied to the first and second data input terminals DI and DIB and, accordingly, to the PMOS transistors MP1 and MP2. It is assumed in the following description that the signals at H and L levels are applied to the input terminals of the inverter gates INV1 and INV2 through the NMOS transistors MN2 and MN1, respectively.

The signal fed from the second data input terminal DIB to the inverter gate INV1 is at the potential VDD−Vthn since the signal passes through the NMOS transistor MN2.

The signal at L level is applied from the first data input terminal DI through the NMOS transistor MN1 to the control terminal of the PMOS transistor MP2 commonly connected to the input terminal of the inverter gate INV2 to turn on the PMOS transistor MP2. This allows the first power supply potential VDD to be applied to the inverter gate INV1 through the PMOS transistor MP2. That is, the potential to be applied to the inverter gate INV1 is pulled up to the potential VDD from the potential VDD−Vthn.

At this time, the PMOS transistor MP1 is off since the gate electrode of the PMOS transistor MP1 is commonly connected to the input terminal of the inverter gate INV1. Thus, the voltage to be applied to the inverter gate INV2 remains at L level.

Similar effects are obtained if the signals at L and H levels are applied to the input terminals of the inverter gates INV1 and INV2 through the NMOS transistors MN2 and MN1, respectively. Specifically, the PMOS transistor MP1 turns on to pull up the potential to be applied to the inverter gate IVN2 to the potential VDD from the potential VDD−Vthn. The voltage to be applied to the inverter gate INV1 remains at L level.

Figure 7:
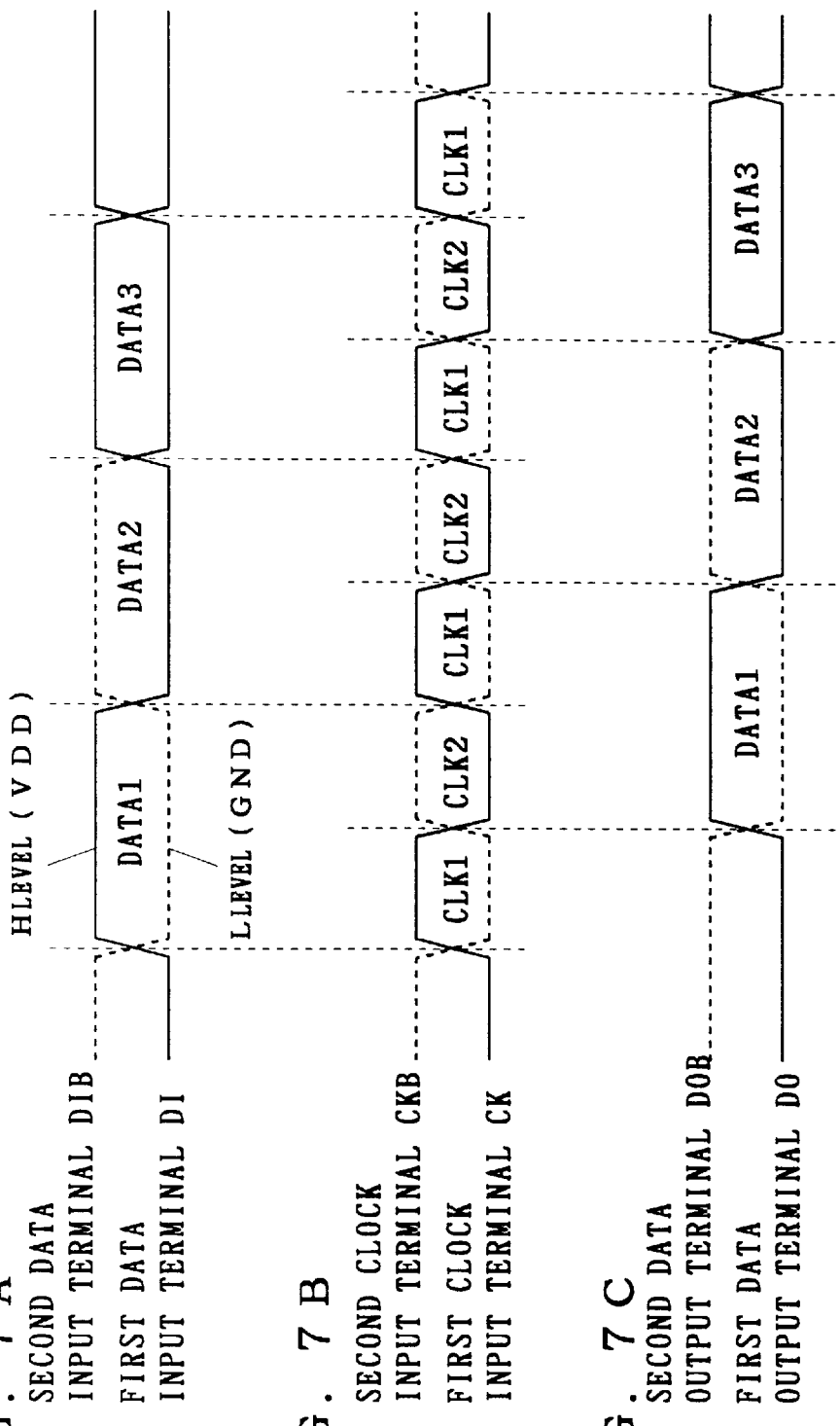
FIGS. 7A to 7C are waveform charts representing a timing chart of the arrangement of FIG. 6.

FIGS. 7A to 7C are waveform charts representing a timing chart of the latch circuit of the second preferred embodiment. It will be apparent from FIGS. 7A to 7C that the circuit operations of the latch circuit of the second preferred embodiment are identical with those of the latch circuit of the first preferred embodiment shown in FIGS. 3A to 3C.

In the second preferred embodiment, the cross-coupled PMOS transistors MP1 and MP2 allow compensation for the voltage drop by the amount of the threshold voltage which is caused by the NMOS transistors MN1 and MN2. This increases an input voltage margin (difference between the input signal level and the logical threshold potential) at H level of the inverter gates INV1 and INV2 connected on the next stages of the NMOS transistors MN2 and MN1, respectively. Thus, a stable circuit operation is provided even if the difference between the potentials at H and L levels is not sufficiently great, for example. Therefore, the second preferred embodiment accomplishes the latch circuit having a high degree of reliability in addition to the effects of the first preferred embodiment.

Figure 8:
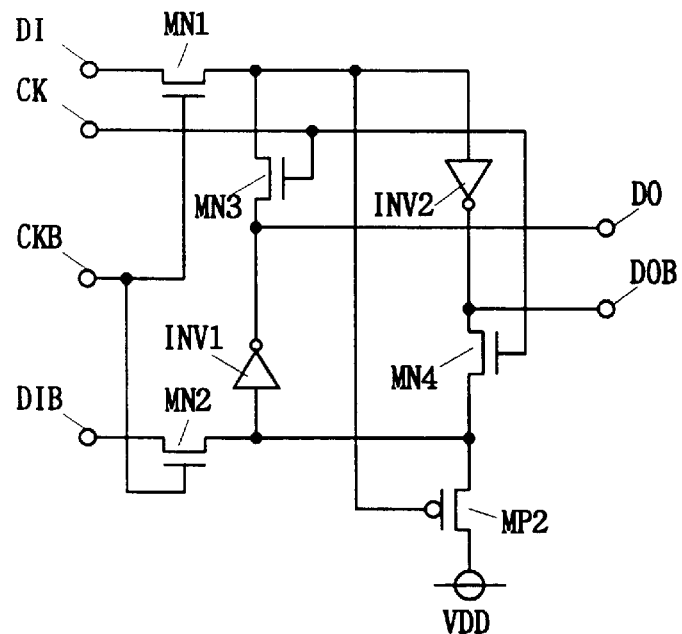
FIG. 8 is a circuit diagram of a second arrangement of the second preferred embodiment.

The effect of the second preferred embodiment may be obtained if the PMOS transistors MP1 and MP2 are not connected in cross-coupled configuration. FIG. 8 is a circuit diagram of the latch circuit constructed such that the PMOS transistor MP1 is removed from the latch circuit of FIG. 6.

The latch circuit of FIG. 8 is incapable of pulling up the potential to be applied to the inverter gate INV2 but is capable of pulling up the potential to be applied to the inverter gate INV1. Therefore, the latch circuit of FIG. 8 is more reliable than the latch circuit of the first preferred embodiment.

Figure 9:
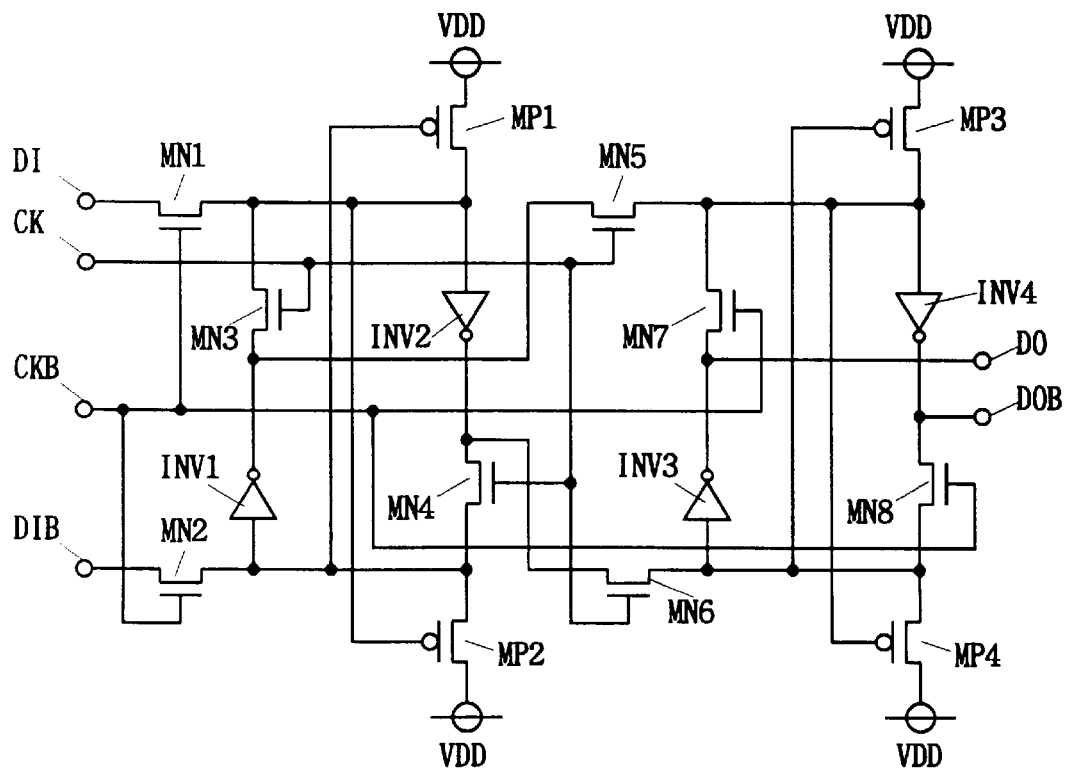
FIG. 9 is a circuit diagram of a third arrangement of the second preferred embodiment.

A flip-flop circuit will be described below which is provided by connecting two latch circuits shown in FIG. 6. FIG. 9 is a circuit diagram of the flip-flop circuit of the second preferred embodiment. The flip-flop circuit of FIG. 9 differs from the flip-flop circuit of the first preferred embodiment shown in FIG. 4 in that it further comprises PMOS transistors MP1 to MP4.

The connection of the PMOS transistors MP3 and MP4 to the inverter gates INV3 and INV4 and the first power supply VDD is similar to the connection of the PMOS transistors MP1 and MP2 to the inverter gates INV1 and INV2 and the first power supply VDD. The PMOS transistors MP3 and MP4 may pull up the potentials to be applied to the inverter gates INV3 and INV4, respectively, to the potential VDD, increasing the reliability of the flip-flop circuit.

Figure 10:
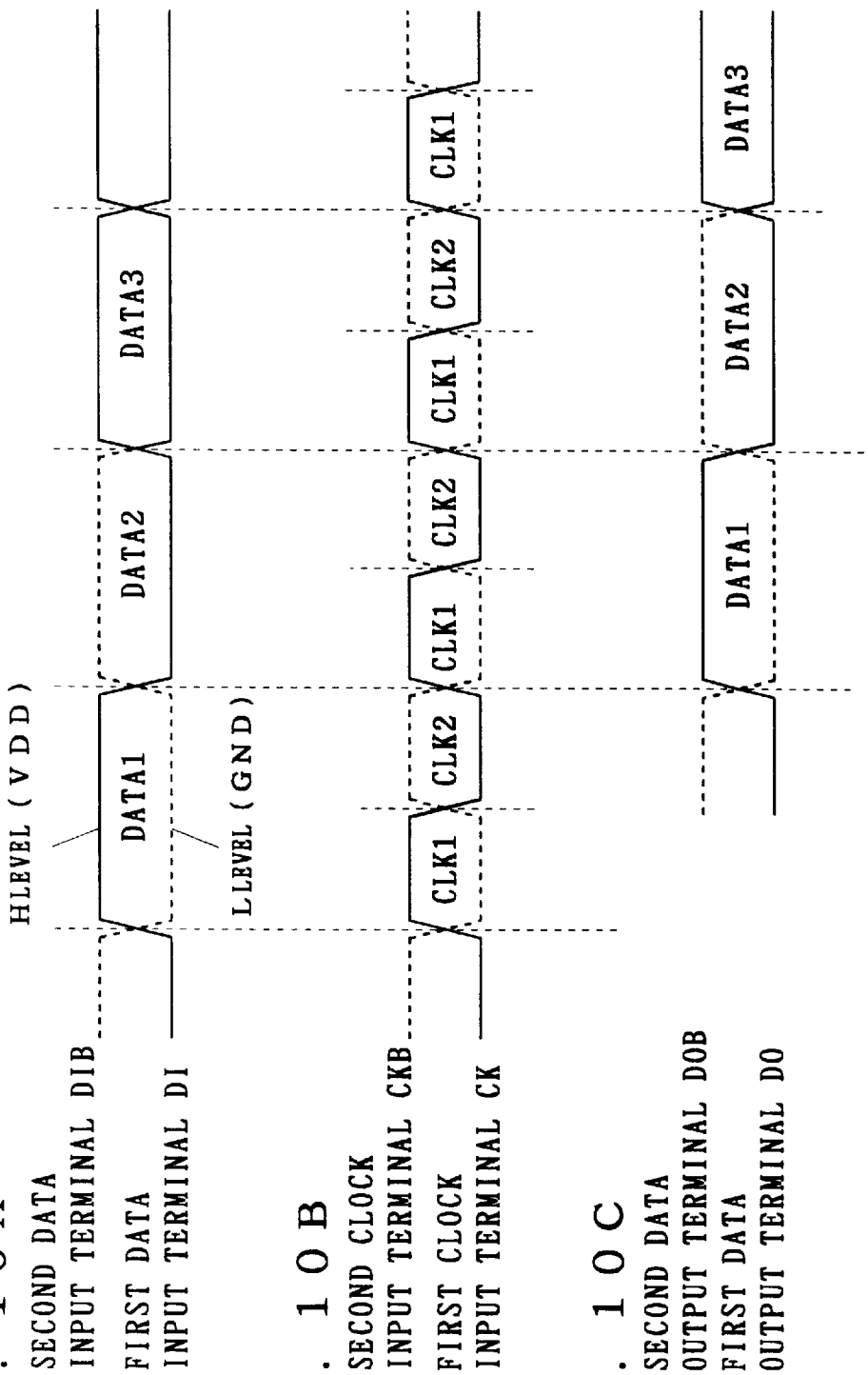
FIGS. 10A to 10C are waveform charts representing a timing chart of the arrangement of FIG. 9.

FIGS. 10A to 10C are waveform charts representing a timing chart of the flip-flop circuit of the second preferred embodiment. It will be apparent from FIGS. 10A to 10C that the circuit operations of the flip-flop circuit of the second preferred embodiment are identical with those of the flip-flop circuit of the first preferred embodiment shown in FIGS. 5A to 5C.

It will be appreciated from the above description that the flip-flop circuit of the second preferred embodiment is similar in effects to the latch circuit of the second preferred embodiment.

Figure 11:
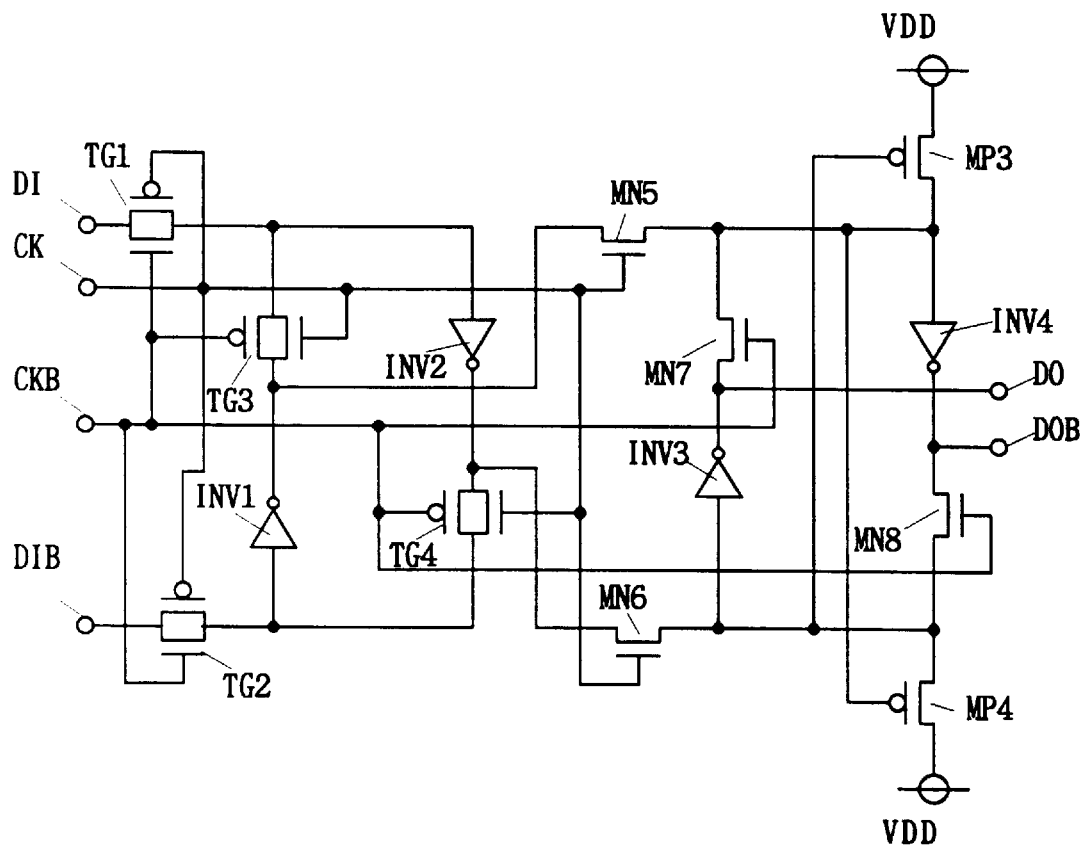
FIG. 11 is a circuit diagram of a fourth arrangement of the second preferred embodiment.

With reference to FIG. 11, the flip-flop circuit may comprise a combination of the conventional latch circuit including the transmission gates and the latch circuit of the second preferred embodiment.

Third Preferred Embodiment

A third preferred embodiment discloses a buffer circuit for outputting substantially synchronized signals representing mutually exclusive logics at two output terminals thereof.

Figure 12:
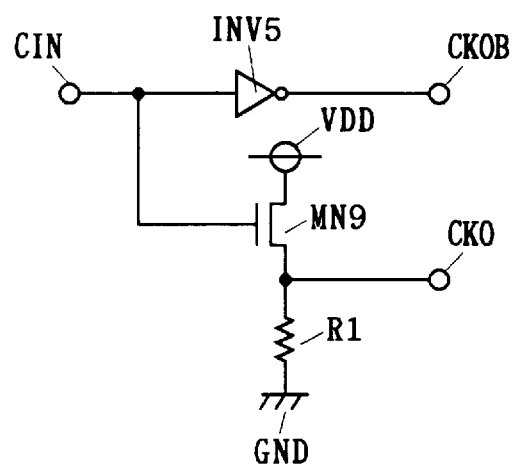
FIG. 12 is a circuit diagram of a first arrangement of a third preferred embodiment according to the present invention.

FIG. 12 is a circuit diagram of the buffer circuit according to the third preferred embodiment for applying clock or data signals to the flip-flop circuit or the latch circuit. The buffer circuit is shown as comprising a signal input terminal CIN, an inverter gate INV5 having an input terminal connected to the signal input terminal CIN, a source follower circuit having an input terminal connected to the signal input terminal CIN, and first and second signal output terminals CKO and CKOB connected to the output terminals of the source follower circuit and the inverter gate INV5, respectively.

The source follower circuit shown in FIG. 12 includes an NMOS transistor MN9 and a resistor R1. The NMOS transistor MN9 has a gate electrode connected to the signal input terminal CIN, a drain electrode connected to the first power supply VDD, and a source electrode connected to the first signal output terminal CKO and connected to the second power supply GND through the resistor R1. The inverter gate INV5 has the structure of FIG. 2.

The circuit operation of the buffer circuit is described below. If a signal at H level is applied to the signal input terminal CIN, the second signal output terminal CKOB outputs a signal at L level by the function of the inverter gate INV5. Turning on the NMOS transistor MN9 causes a current flow in the resistor R1 to develop a voltage drop. The voltage drop by the amount of the threshold voltage Vthn is developed in the NMOS transistor MN9. Thus, a signal at the potential VDD−Vthn is applied to the first signal output terminal CKO.

If a signal at L level is applied to the signal input terminal CIN, the first signal output terminal CKO is grounded through the resistor RI because of the turning off of the NMOS transistor MN9 to output a signal at L level, and the second signal output terminal CKOB outputs a signal at H level.

Figure 13:
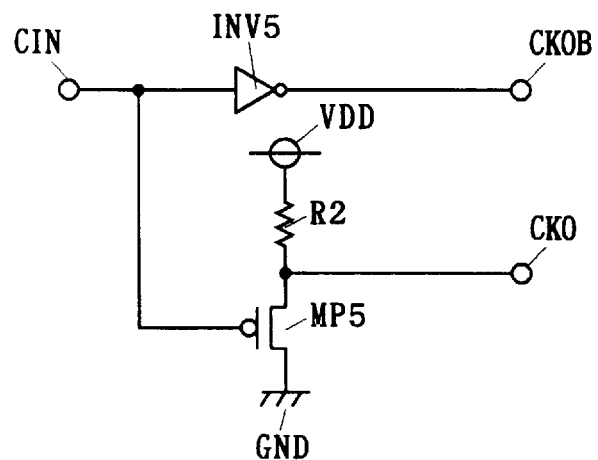
FIG. 13 is a circuit diagram of a second arrangement of the third preferred embodiment.

Referring to FIG. 13, the source follower circuit may comprise a PMOS transistor MP5 having a drain electrode connected to the second power supply GND, a source electrode connected to the first power supply VDD through a resistor R2 and connected to the first signal output terminal CKO, and a gate electrode connected to the signal input terminal CIN. The source follower circuit of FIG. 13 outputs a signal at a potential higher than the potential GND by the amount of a voltage Vthp which is the absolute value of the threshold voltage of the PMOS transistor MP5 if a signal at L level is applied to the signal input terminal CIN.

In the above stated buffer circuit, the characteristics of the inverter gate INV5 and source follower circuit determine the difference between the delays of the signals outputted from the first and second signal output terminals CKO and CKOB. There is a strong resemblance in signal output characteristics with time between the inverter gate comprised of two in-series connected MOS transistors and the source follower circuit comprised of a resistor and an MOS transistor which are connected in series. Therefore, the third preferred embodiment may provide the buffer circuit having a short delay between two complementary output signals.

In the conventional buffer circuit, the first signal output terminal CKO outputs a signal with a delay of two inverter gates after a signal was applied to the signal input terminal CIN. However, the third preferred embodiment produces a delay of about one inverter gate INV5. Therefore, the latch circuit and flip-flop circuit connected to the buffer circuit may operate at high speeds.

Figure 14:
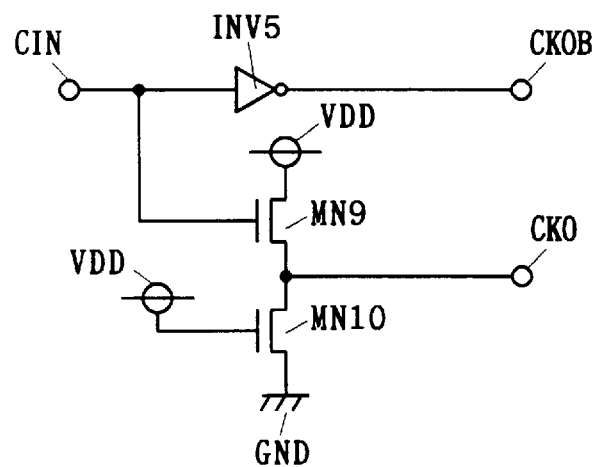
FIG. 14 is a circuit diagram of a third arrangement of the third preferred embodiment.

FIGS. 14 and 16 illustrate source follower circuits each including two MOS transistors. The source follower circuit of FIG. 14 is constructed such that the resistor R1 constituting the source follower circuit of FIG. 12 is replaced with an NMOS transistor MN10 having a gate electrode connected to the first power supply VDD. Similarly, the source follower circuit of FIG. 16 is constructed such that the resistor R2 constituting the source follower circuit of FIG. 13 is replaced with a PMOS transistor MP6 having a gate electrode connected to the second power supply GND.

It is not desirable that the values of the resistors R1 and R2 or the ON-state resistance of the NMOS transistor MN10 or PMOS transistor MP6 is excessively low. The excessively low values of the resistors R1 and R2 or ON-state resistance of the NMOS transistor MN10 or PMOS transistor MP6 does not permit the current flowing through the resistors R1, R2, the NMOS transistor MN10, or the PMOS transistor MP6 to develop a sufficient voltage drop when the NMOS transistor MN9 or PMOS transistor MP5 turn on, resulting in correspondingly dull potential applied to the first signal output terminal CKO.

Figures 17A, 17B, 17C, 18:
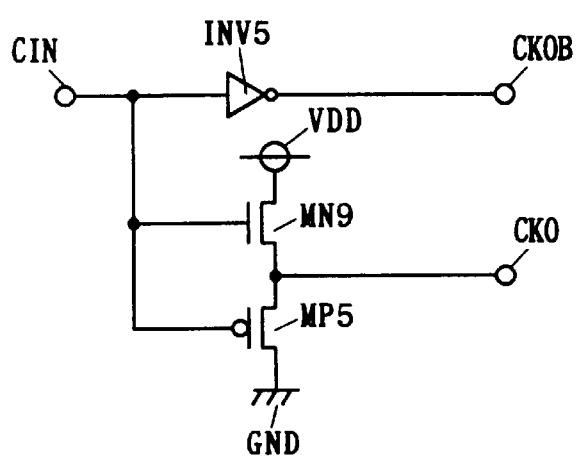
FIGS. 17A to 17C are waveform charts representing a timing chart of the arrangement of FIG. 16.
FIG. 18 is a circuit diagram of an arrangement of a fourth preferred embodiment according to the present invention.

FIGS. 15A to 15C are waveform charts representing a timing chart of the buffer circuit of FIG. 14. FIGS. 17A to 17C are waveform charts representing a timing chart of the buffer circuit of FIG. 16. The signal output from the second signal output terminal CKOB lags behind the signal input to the signal input terminal CIN by the amount of a switching delay d5 of the inverter gate INV5. As shown in FIGS. 15C and 17C, the signal output from the first signal output terminal CKO lags behind the signal input to the signal input terminal CIN by the amounts of switching delays s1 and s2 of the source follower circuits, respectively.

There is a resemblance in characteristics with time between the inverter gate and the source follower circuit each comprised of two MOS transistors. Thus, the switching delays s1, s2 and d5 are substantially equal, and the signals outputted from the first and second signal output terminals CKO and CKOB are substantially in synchronism with each other.

An MOS transistor which is on by the connection to a constant potential source is similar in function to a resistor. Thus, the buffer circuits shown in FIGS. 14 and 16 are similar to the buffer circuits shown in FIGS. 12 and 13 except the characteristics with time. However, the formation of the buffer circuit including the resistors R1 and R2 involves the step of particularly forming the resistors. On the other hand, the buffer circuit including the source follower circuit comprised of only MOS transistors does not require the step of forming the resistors, and accordingly is easy to fabricate.

In this manner, the buffer circuit of the third preferred embodiment produces two suitably synchronized signals in logically opposite relation in response to the input signal.

Fourth Preferred Embodiment

A fourth preferred embodiment discloses a buffer circuit comprising a source follower circuit including two MOS transistors which mutually exclusively turn on and off.

FIG. 18 is a circuit diagram of the buffer circuit of the fourth preferred embodiment which is constructed such that the source follower circuit of the buffer circuit of the third preferred embodiment is partially replaced.

The source follower circuit includes an NMOS transistor MN9 and a PMOS transistor MP5. Drain electrodes of the NMOS and PMOS transistors MN9 and MP5 are connected to the first and second power supplies VDD and GND, respectively. Source electrodes of the NMOS and PMOS transistors MN9 and MP5 are commonly connected to the first signal output terminal CKO, and gate electrodes thereof are commonly connected to the signal input terminal CIN. This source follower circuit may be regarded as the source follower circuit of FIG. 12 with the resistor R1 replaced with the PMOS transistor MP5 or as the source follower circuit of FIG. 13 with the resistor R2 replaced with the NMOS transistor MN9.

The NMOS transistor MN9 and PMOS transistor MP5 having the commonly connected gate electrodes turn on and off in mutually exclusive relation. Therefore, the buffer circuit including the source follower circuit of the fourth preferred embodiment may eliminate the influence resulting from the NMOS transistor MN10 and PMOS transistor MPF6 of the source follower circuit of the third preferred embodiment shown in FIGS. 14 and 16 which are always on.

The buffer circuit of the third preferred embodiment must be designed so that the ON-state resistances of the NMOS transistor MN10 and PMOS transistor MP6 are not excessively low when the transistors are formed. On the other hand, the buffer circuit of the fourth preferred embodiment eliminates such design restriction since the NMOS transistor MN9 and PMOS transistor MP5 turn on and off in mutually exclusive relation.

When the signal at H level is applied to the signal input terminal CIN, the PMOS transistor MP5 turns off. Then, the potential VDD−Vthn is applied to the first signal output terminal CKO through the NMOS transistor MN9. Likewise, when the signal at L level is applied to the signal input terminal CIN, the NMOS transistor MN9 turns off. Then, the potential GND+Vthp is applied to the first signal output terminal CKO through the PMOS transistor MP5.

Figures 19A, 19B, 19C, 20:
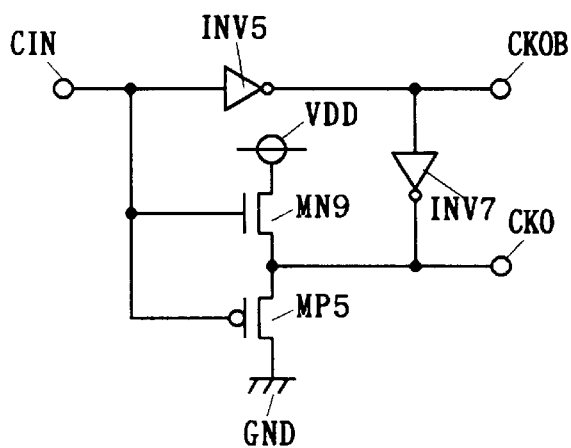
FIGS. 19A to 19C are waveform charts representing a timing chart of the arrangement of FIG. 18.
FIG. 20 is a circuit diagram of a first arrangement of a fifth preferred embodiment according to the present invention.

FIGS. 19A to 19C are waveform charts representing a timing chart of the buffer circuit of the fourth preferred embodiment. Referring to FIG. 19C, the first signal output terminal CKO provides the output signal after a switching delay s3 of the source follower circuit. The delay s3 is substantially equal to the delay d5 of the inverter gate INV5, and the two output signals are substantially in synchronism with each other.

The timing chart shown in FIG. 19C illustrates the signal at the first signal output terminal CKO when the input signal has a short signal cycle. As above described, one of the PMOS transistor MP5 and NMOS transistor MN9 which constitute the source follower circuit is always off. Thus, if the input signal has a very long signal cycle, the signal at the first signal output terminal CKO transmitted through one of the transistors which is on reaches the potential VDD or potential GND.

That is, after an elapse of sufficiently long time, the potential of the signal at the first signal output terminal CKO changes from the potential VDD−Vthn to the potential VDD or changes from the potential GND+Vthp to the potential GND.

Fifth Preferred Embodiment

A fifth preferred embodiment discloses a buffer circuit which may completely pull up or down the potentials of the output signals.

FIG. 20 is a circuit diagram of the buffer circuit of the fifth preferred embodiment of the present invention. The buffer circuit of FIG. 20 differs from the buffer circuit of FIG. 18 in that it further comprises an inverter gate INV7 having an output terminal connected to the first signal output terminal CKO and an input terminal connected to the second signal output terminal CKOB.

The circuit operation of the buffer circuit is described below. When a signal at H level is applied to the signal input terminal CIN, the source follower circuit first provides the potential VDD−Vthn through the first signal output terminal CKO. Then, the output from the inverter gate INV7 has the potential VDD after a delay of one gate to provide the potential VDD to the first signal output terminal CKO. Similarly, when a signal at L level is applied to the signal input terminal CIN, the source follower circuit first provides the potential GND+Vthp to the first signal output terminal CKO, and then the inverter gate INV7 provides the potential GND thereto.

FIGS. 21A to 21C are waveform charts representing a timing chart of the buffer circuit of the fifth preferred embodiment. The signal outputted from the first signal output terminal CKO lags by the amount of the delay s3 and is substantially in synchronism with the signal outputted after the delay d5 from the second signal output terminal CKOB. The signal outputted from the first signal output terminal CKO is shown as set to H level or L level by the inverter gate INV7.

Figure 23:
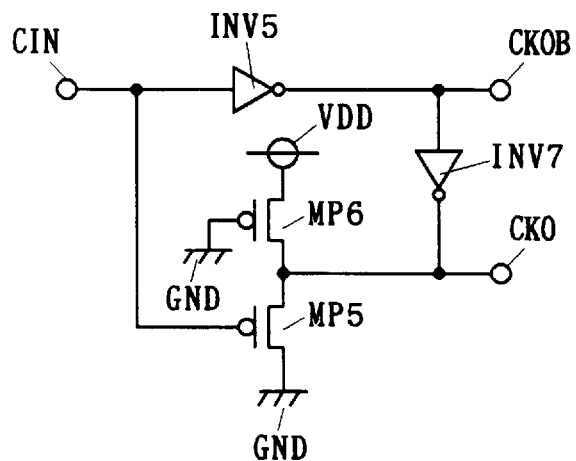
FIG. 23 is a circuit diagram of a third arrangement of the fifth preferred embodiment.

With reference to FIGS. 22 and 23, the inverter gate INV7 may be added to the buffer circuits of FIGS. 14 and 16, providing similar effects. In the buffer circuit of FIG. 22, the signal at the potential VDD−Vthn is pulled up to H level (potential VDD). In the buffer circuit of FIG. 23, the signal at the potential GND +Vthp is pulled down to L level (potential GND).

The buffer circuit of the fifth preferred embodiment may provide the signals at H and L levels with a full swing while quickly determining the logic of the output signals. This ensures the operation of the latch circuit or flip-flop circuit connected to the buffer circuit.

While the invention has been described in detail, the foregoing description is in all aspects illustrative and not restrictive. It is understood that numerous other modifications and variations can be devised without departing from the scope of the invention.

We claim:

1. A data holding circuit comprising:
    first and second signal input terminals;
    first and second clock terminals;
    first and second transistors of a first conductivity type having control terminals connected to said second clock terminal, and first current electrodes connected to said first and second signal input terminals, respectively;
    third and fourth transistors of said first conductivity type having control terminals connected to said first clock terminal, and first current electrodes connected to second current electrodes of said first and second transistors, respectively;
    a first signal inverting circuit having an input terminal connected to said second current electrode of said second transistor, and an output terminal connected to a second current electrode of said third transistor;
    a second signal inverting circuit having an input terminal connected to said second current electrode of said first transistor, and an output terminal connected to a second current electrode of said fourth transistor;
    a fifth transistor of a second conductivity type having a control terminal connected to said input terminal of said second signal inverting circuit, a first current electrode connected to said input terminal of said first signal inverting circuit, and a second current electrode connected to a first constant potential terminal; and
    first and second signal output terminal connected to said output terminals of said first and second signal inverting circuits, respectively,
    wherein first and second potentials lie within first and second potential bands isolated from each other, respectively,
    wherein mutually different two logics of binary logics are contained in said first and second potential bands, respectively,
    said first and second signal input terminals receiving said first and second potentials in mutually exclusive relation,
    said first and second clock terminals receiving potentials lying respectively within said first and second potential bands in mutually exclusive relation,
    wherein a transistor of said first conductivity type turns on and off in response to potentials lying within said first and second potential bands applied at its control terminal, respectively,
    wherein a transistor of said second conductivity type turns off and on in response to potentials lying within said first and second potential bands applied at its control terminal, respectively,
    said first constant potential terminal providing a potential which is farther from said second potential than said first potential is or is equal to said first potential.

2. The data holding circuit of claim 1, further comprising:
    a sixth transistor of said second conductivity type having a control terminal connected to said input terminal of said first signal inverting circuit, a first current electrode connected to said input terminal of said second signal inverting circuit, and a second current electrode connected to a second constant potential terminal,
    said second constant potential terminal providing a potential which is farther from said second potential than said first potential is or is equal to said first potential.

3. A data holding circuit comprising:
    a first data holding circuit which is the data holding circuit recited in claim 2, and
    a second data holding circuit including:
        first and second transistors of said first conductivity type having control terminals connected to said first clock terminal, and first current electrodes connected to said first and second signal output terminals of said first data holding circuit, respectively;
        third and fourth transistors of said first conductivity type having control terminals connected to said second clock terminal, and first current electrodes connected to second current electrodes of said first and second transistors of said second data holding circuit, respectively;
        a first signal inverting circuit having an input terminal connected to said second current electrode of said second transistor of said second data holding circuit, and an output terminal connected to a second current electrode of said third transistor of said second data holding circuit;
        a second signal inverting circuit having an input terminal connected to said second current electrode of said first transistor of said second data holding circuit, and an output terminal connected to a second current electrode of said fourth transistor of said second data holding circuit;
        a fifth transistor of said second conductivity type having a control terminal connected to said input terminal of said second signal inverting circuit of said second data holding circuit, a first current electrode connected to said input terminal of said first signal inverting circuit of said second data holding circuit, and a second current electrode connected to a third constant potential terminal;

first and second signal input terminals connected to said output terminals of said first and second signal inverting circuits of said second data holding circuit, respectively; and a sixth transistor of said second conductivity type having a control terminal connected to said input terminal of said first signal inverting circuit of said second data holding circuit, a first current electrode connected to said input terminal of said second signal inverting circuit of said second data holding circuit, and a second current electrode connected to a fourth constant potential terminal, said third constant potential terminal providing a potential which is farther from said second potential than said first potential is or is equal to said first potential, said fourth constant potential terminal providing a potential which is farther from said second potential than said first potential is or is equal to said first potential.

4. A data holding circuit comprising:

first and second clock terminals receiving clock signals which have logical levels in mutually exclusive relation;

first and second field effect transistors of a first conductivity type having control terminals connected to said second clock terminal, and first current electrodes connected to first and second signal input lines receiving input signals, respectively;

third and fourth field effect transistors of said first conductivity type having control terminals connected to said first clock terminal, and first current electrodes connected to second current electrodes of said first and second field effect transistors, respectively;

a first signal inverting circuit having an input terminal connected to said second current electrode of said second field effect transistor, and an output terminal connected to a second current electrode of said third field effect transistor and a first signal output line outputting a signal;

a second signal inverting circuit having an input terminal connected to said second current electrode of said first field effect transistor, and an output terminal connected to a second current electrode of said fourth field effect transistor and a second signal output line outputting a signal; and a fifth field effect transistor of a second conductivity type having a control terminal connected to said input terminal of said second signal inverting circuit, a first current electrode connected to said input terminal of said first signal inverting circuit, and a second current electrode provided a potential so that said first and second electrodes of said fifth field effect transistor are drain and source electrodes, respectively.

5. The data holding circuit of claim 4, further comprising:

a sixth field effect transistor of said second conductivity type having a control terminal connected to said input terminal of said first signal inverting circuit, a first current electrode connected to said input terminal of said second signal inverting circuit, and a second current electrode provided a potential so that said first and second electrodes of said sixth field effect transistor are drain and source electrodes, respectively.

6. The data holding circuit of claim 5, wherein said second electrodes of said fifth and sixth field effect transistors are provided with a same potential.

7. The data holding circuit of claim 5, further comprising:

seventh and eighth field effect transistors of said first conductivity type having control terminals connected to said first clock terminal, and first current electrodes connected to third and fourth signal input lines receiving input signals, respectively;

ninth and tenth field effect transistors of said first conductivity type having control terminals connected to said second clock terminal, and first current electrodes connected to second current electrodes of said seventh and eighth field effect transistors, respectively;

a third signal inverting circuit having an input terminal connected to said second current electrode of said eighth field effect transistor, and an output terminal connected to a second current electrode of said ninth field effect transistor; and a fourth signal inverting circuit having an input terminal connected to said second current electrode of said seventh field effect transistor, and an output terminal connected to a second current electrode of said tenth field effect transistor;

wherein said first and second input lines are connected to said output terminals of said third and fourth signal inverting circuits, respectively.

8. The data holding circuit of claim 7, further comprising:

eleventh and twelfth field effect transistors of said second conductivity type having control terminals connected to said second clock terminal, and first current electrodes connected to said first current electrodes of said seventh and eighth field effect transistors, respectively, and second current electrodes connected to said second current electrodes of said seventh and eighth field effect transistors, respectively; and thirteenth and fourteenth field effect transistors of said second conductivity type having control terminals connected to said first clock terminal, and first current electrodes connected to said first electrode of said ninth and tenth field effect transistors, respectively, and second current electrodes connected to said second electrodes of said ninth and tenth field effect transistors, respectively.

9. A data holding circuit comprising:

first and second clock terminals receiving clock signals which have logical levels in mutually exclusive relation;

first and second field effect transistors of a first conductivity type having control terminals connected to said second clock terminal, and first current electrodes connected to first and second signal input lines receiving input signals, respectively;

third and fourth field effect transistors of said first conductivity type having control terminals connected to said first clock terminal, and first current electrodes connected to second current electrodes of said first and second field effect transistors, respectively;

a first signal inverting circuit having an input terminal connected to said second current electrode of said second field effect transistor, and an output terminal connected to said second current electrode of said third field effect transistor;

a second signal inverting circuit having an input terminal connected to said second current electrode of said first field effect transistor, and an output terminal connected to said second current electrode of said fourth field effect transistor;

a fifth field effect transistor of a second conductivity type having a control terminal connected to said input terminal of said second signal inverting circuit, a first current electrode connected to said input terminal of said first signal inverting circuit, and a second current electrode provided a potential so that said first and second electrodes of said fifth field effect transistor are drain and source electrodes, respectively;

a sixth field effect transistor of said second conductivity type having a control terminal connected to said input terminal of said first signal inverting circuit, a first current electrode connected to said input terminal of said second signal inverting circuit, and a second current electrode provided a potential so that said first and second electrodes of said sixth field effect transistor are drain and source electrodes, respectively;

seventh and eighth field effect transistors of said first conductivity type having control terminals connected to said first clock terminal, and first current electrodes connected to said output terminals of said first and second signal inverting circuits, respectively;

ninth and tenth field effect transistors of said first conductivity type having control terminals connected to said second clock terminal, and first current electrodes connected to second current electrodes of said seventh and eighth field effect transistors, respectively;

a third signal inverting circuit having an input terminal connected to said second current electrode of said eighth field effect transistor, and an output terminal connected to a second current electrode of said ninth field effect transistor;

a fourth signal inverting circuit having an input terminal connected to said second current electrode of said seventh field effect transistor, and an output terminal connected to a second current electrode of said tenth field effect transistor;

an eleventh field effect transistor of said second conductivity type having a control terminal connected to said input terminal of said fourth signal inverting circuit, a first current electrode connected to said input terminal of said third signal inverting circuit, and a second current electrode provided a potential so that said first and second electrodes of said eleventh field effect transistor are drain and source electrodes, respectively; and a twelfth field effect transistor of said second conductivity type having a control terminal connected to said input terminal of said third signal inverting circuit, a first current electrode connected to said input terminal of said fourth signal inverting circuit, and a second current electrode provided a potential so that said first and second electrodes of said twelfth field effect transistor are drain and source electrodes, respectively.

10. The data holding circuit of claim 9, wherein said second electrodes of said fifth, sixth, eleventh and twelfth field effect transistors are provided with a same potential.

* * * * *